United States Patent
Sun et al.

(10) Patent No.: US 8,198,944 B2
(45) Date of Patent: *Jun. 12, 2012

(54) DIGITALLY CONTROLLED OSCILLATOR WITH IMPROVED DIGITAL FREQUENCY CALIBRATION

(75) Inventors: Bo Sun, Carlsbad, CA (US); Zixiang Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 151 days.

This patent is subject to a terminal disclaimer.

(21) Appl. No.: 12/366,576

(22) Filed: Feb. 5, 2009

(65) Prior Publication Data

US 2010/0102894 A1    Apr. 29, 2010

Related U.S. Application Data

(60) Provisional application No. 61/108,959, filed on Oct. 28, 2008.

(51) Int. Cl.
*G01R 23/00* (2006.01)
(52) U.S. Cl. .......... 331/44; 331/16; 331/177 R; 331/179
(58) Field of Classification Search ............ 331/16, 331/44, 177 R, 179
See application file for complete search history.

(56) References Cited

U.S. PATENT DOCUMENTS

| 7,280,001 B2 * | 10/2007 | Maligeorgos et al. ........ 331/158 |
| 7,675,370 B2 * | 3/2010 | Sun et al. ......................... 331/44 |
| 2007/0001823 A1 | 1/2007 | Der et al. |
| 2008/0094147 A1 | 4/2008 | Olsson et al. |
| 2008/0129398 A1 | 6/2008 | Sun et al. |

OTHER PUBLICATIONS

International Search Report—PCT/US2009/062258—International Search Authoriy—European Patent Office, Jan. 27, 2010.
Written Opinion — PCT/US2009/062258 — ISA/EPO — Jan. 27, 2010.

* cited by examiner

*Primary Examiner* — Joseph Chang
*Assistant Examiner* — Jeffrey Shin
(74) *Attorney, Agent, or Firm* — S. Hossain Beladi

(57) ABSTRACT

Techniques for calibrating digitally controlled oscillators (DCOS) are disclosed. In one aspect of the disclosure, an initial set of control codes for operating the DCO with a coarse frequency tuning bank with multiple overlapping coarse frequency tuning segments (LTBs) and one fine main frequency tuning bank (MTB) is determined. A range of output frequencies produced from the initial set is identified. Instances of overlap are identified in the frequency range between consecutive LTB segments. An offset in the MTB is added that corresponds to the overlap instance between consecutive LTBs to establish a revised set. The revised control codes are utilized to tune the DCO over the desired frequency range.

18 Claims, 16 Drawing Sheets

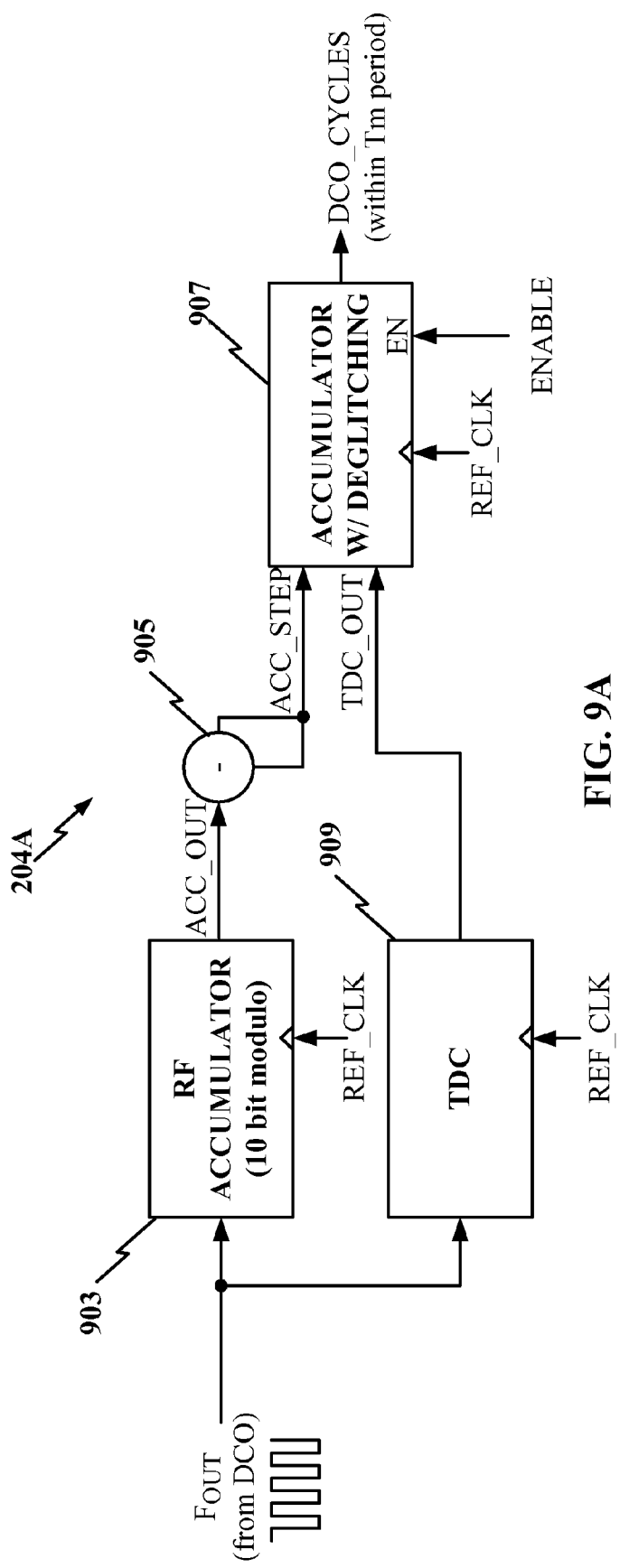
FIG. 9A
FIG. 9B

DIGITALLY CONTROLLED OSCILLATOR WITH IMPROVED DIGITAL FREQUENCY CALIBRATION

TECHNICAL FIELD

This disclosure relates generally to the field of electronics, and more specifically, but not exclusively, to digitally controlled oscillators.

BACKGROUND

A digitally controlled oscillator (DCO) is an electronic circuit for synthesizing a range of frequencies from a fixed reference clock. The nominal output frequency generated by a DCO is a function of the value of a digital input or control code. DCOs may be used as frequency synthesizers for a variety of electronic circuit-based applications. DCOs are being increasingly employed, for example, in the arenas of wireless communications, mobile digital video broadcasting, fixed cable and satellite TV tuners, digital signal processing, and a host of other radio-frequency and system on-chip circuit designs.

For applications involving conventional wireless communications devices including mobile phones and portable computers, the DCO-produced waveforms may be used to implement functions such as clock and data recovery, carrier wave synthesis, signal encoding/decoding and modulation/demodulation, programmable waveform generation, and the like. Many recent applications involving wireless communications have seen the widespread use of DCOs implemented within digital phase-locked loops (DPLLs) for a radio frequency (RF) local-oscillator (LO). Due to its digital nature, the DCO can offer fast switching between output frequencies, fine frequency setting resolution, and operation over a broad frequency range. DCOs may also offer superior noise rejection over conventional circuit techniques by reducing the number of analog circuit components, and reducing or eliminating noise susceptible parameters such as oscillator control voltages, etc.

As the demand for smaller integrated circuit (IC) DCOs with fast switching between finer output frequency resolution escalates, so too have the problems associated with parasitic circuit values and impedance mismatches for various circuit elements that make up IC DCOs. In practical implementations, linear input codes tend to produce non-linear output frequencies from DCOs—specifically, gaps or instances of overlap in a plot of output frequency versus input control code.

A need persists in the art for effectively identifying and correcting these instances of nonlinearity in a DCO.

SUMMARY

Techniques for calibrating digitally controlled oscillators (DCOs) are disclosed. In one aspect of the disclosure, an initial set of control codes for operating the DCO with a coarse frequency tuning bank with multiple overlapping coarse frequency tuning segments (LTBs) and one fine main frequency tuning bank (MTB) is determined. A range of output frequencies produced from the initial set is identified. Instances of overlap are identified in the frequency range between consecutive LTB segments. An offset in the MTB is added that corresponds to the overlap instance between consecutive LTBs to establish a revised set. The revised control codes are utilized to tune the DCO over the desired frequency range.

The MTB and LTBs are therefore employed to adjust DCO output frequency as a function of a set of linear input control codes for an overall radio-frequency (RF) tuning range. The MTB is composed of small thermometer capacitive elements to shift the operating frequency with a desired frequency resolution in monotonic steps in the kHz range utilizing multiple least-significant bits encoded from the linear input control codes. Additionally, the MTB may be designed to be a portion of the overall RF tuning range, with fine frequency steps that correspond to the designed DCO frequency step resolution in the kHz range.

Larger frequency steps are implemented independently of the MTB by the plural LTBs (LTB0, LTB1, . . . LTBn). Each LTB has an equal or smaller frequency tuning range than the MTB. In one embodiment, there are 16 LTBs represented by 4 most-significant bits (MSBs) of the linear input control code. Within each LTB, frequency steps are represented by 4 bits or 16 equal frequency steps. In an example design with 4 bits of frequency resolution within each LTB, each LTB has 80 MHz of tuning range with 5 MHz frequency steps (4 bits or 16 steps). An encoder is designed to map the input codes to separate outputs for the MTB and LTB0, LTB1, . . . LTBn.

An initial set of input control codes for each consecutive LTB (LTB0, LTB1, . . . LTBn) operating a DCO over a target frequency range may be determined with a fixed value for MTB (mid-scale as an example). An initial set of output frequencies produced may be identified for each LTB segment from the initial set of input control codes with the fixed value for the MTB at mid-scale. Non-linear gaps or instances of overlap in DCO output frequency for the initial set of control codes between consecutive LTB segments may be identified and removed by introducing offsets to the MTB for each LTB segment. Therefore, it is important that the MTB have sufficient frequency tuning range to eliminate the frequency gaps and overlaps between consecutive LTBs while still providing the fine frequency step control for the DCO within the tuning range of each LTB.

Various other aspects and embodiments of the disclosure are described in further detail below.

The summary is neither intended nor should it be construed as being representative of the full extent and scope of the present disclosure, which these and additional aspects will become more readily apparent from the detailed description, particularly when taken together with the appended drawings.

BRIEF DESCRIPTION OF THE DRAWINGS

FIG. 9A is a diagram of a circuit for measuring DCO cycles within a measuring period, Tm.

FIG. 9B is a series of plots showing the waveforms for the circuit of FIG. 9A.

DETAILED DESCRIPTION

The detailed description set forth below in connection with the appended drawings is intended as a description of various configurations of the invention and is not intended to represent the only configurations in which the invention may be practiced. The detailed description includes specific details for the purpose of providing a thorough understanding of the invention. However, it will be apparent to those skilled in the art that the invention may be practiced without these specific details. In some instances, well-known structures and components are shown in block diagram form in order to avoid obscuring the concepts of the invention.

DCOs have increasingly been implemented within wireless communication devices that transmit and/or receive wireless signals. Where a DCO is used to generate local oscillator waveforms, baseband signals are modulated on to the local oscillator waveforms at radio frequencies (RF), and then the modulated carrier waveforms are transmitted to other devices as wireless RF signals. The receiving devices may use a DCO, in turn, to synthesize a carrier local oscillator waveform and convert the received RF signal into a baseband signal set (I and Q phases) for demodulation.

Figure 1A:
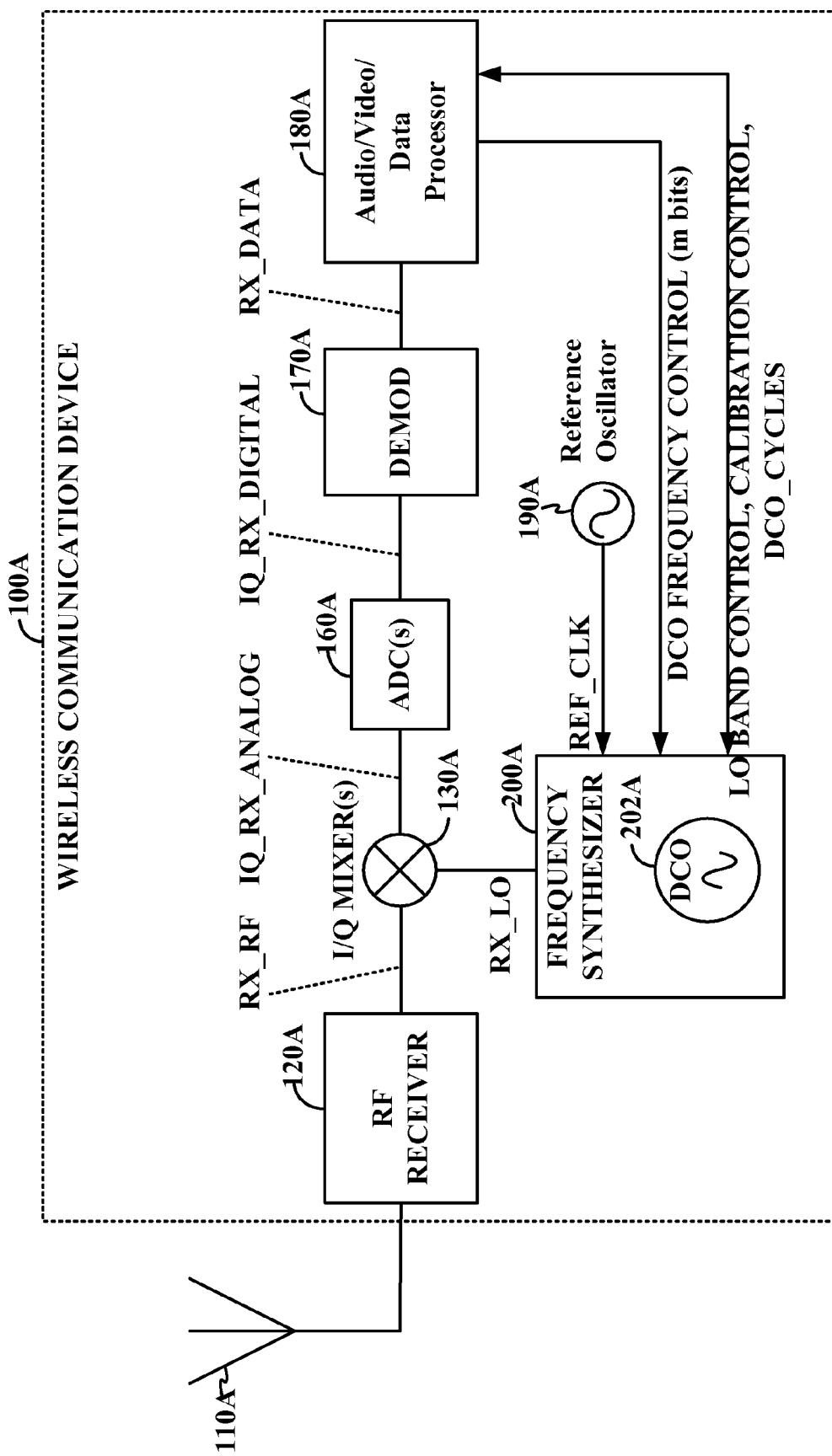
FIG. 1A is a block diagram of a wireless communication device incorporating a wireless receiver.

FIG. 1A is a block diagram of a wireless communication device incorporating a wireless receiver 100A in accordance with the present embodiment as shown. The wireless communication device 100A may implement a so-called "Zero-IF" architecture, although this disclosure is not limited in this respect. In Zero-IF architectures, WCD 100A converts incoming signals directly into baseband signals.

Wireless communication device 100A includes antenna 110A that receives incoming wireless signals. By way of example, the incoming wireless signals may comprise code division multiple access (CDMA) modulated signals sent from a CDMA base station. GSM signals or other types of wireless signals, however, may also be supported. In the illustrated example, wireless signal received by antenna 110A can be processed by RF receiver 120A passing the signal through low-noise amplifier (LNA) and one or more filters to produce a RX_RF signal. The RX_RF signal is then down-converted to baseband by I/Q mixer pair 130A (sometimes called frequency down-conversion). I/Q mixer pair 130A also receive a radio frequency signal, RX_LO, produced by frequency synthesizer 200A. Frequency synthesizer 200A includes DCO 202A to generate a local oscillator frequency. As compared to a voltage controlled oscillator (VCO)—an analog counterpart to DCO 202A, DCO 202A improves the frequency synthesis process, reduces noise in the RX_LO output signal, and allow for simplification of various components of frequency synthesizer 200A and WCD 100A. Frequency synthesizer 200A and DCO 202A receive a REF_CLK signal from reference oscillator 190A. DCO 202A frequency and phase locks to the REF_CLK signal input to set the desired RX_LO frequency as will be shown in subsequent FIGS. 2A, 9A-9B.

I/Q mixer pair 130A produces baseband I/Q signals (IQ_RX_ANALOG signal path) which may be filtered and sampled by analog-to-digital converters (ADCs) 160A to produce corresponding digital samples of the baseband I/Q signals (IQ_RX_DIGITAL). IQ_RX_DIGITAL signals are provided to DEMOD unit 170A, which comprises a demodulator.

For CDMA-based applications, DEMOD 170A may include a so-called "RAKE" receiver, which separates and tracks phase modulated spread spectrum signals received from different sources, e.g., different base stations, or signals received from the same source via multiple propagation paths, i.e., multi-path signals. In this instance, DEMOD unit 170A may include a number of "fingers" that perform dispreading, Walsh decoding and accumulation, pilot time tracking and frequency tracking. Each finger of DEMOD unit 170A outputs pilot and data symbols for the corresponding path. Symbol demodulation and/or other signal processing may then be performed on the pilot and data symbols.

After DEMOD unit 170A decodes the received IQ_RX_DIGITAL signals into a digital data stream (RX_DATA), an Audio/Video/Data Processor 180A (processor 180A) runs different algorithms depending on the RX_DATA such as decoding and driving a speaker for audio content, decoding and displaying video content, or formatting RX_DATA for further processing (IP traffic, game content, etc). Processor 180A also controls frequency synthesizer 200A and DCO 202A with DCO frequency control (m bits), LO band control (one or more bits depending on the number of RX_LO frequency bands), and DCO calibration measurement with a DCO_CYCLE signal and calibration control (the latter two are optional if not self-contained within frequency synthesizer 200A or DCO 202A) as will be explained in reference to FIG. 2A and FIGS. 9A-9B.

As desired, wireless communication device 100A may also include additional components (not shown) such as filters and various digital or analog signal processing components. Wireless communication device may alternatively or additionally be employed to process signals using time division multiple access (TDMA), or frequency division multiple access (FDMA), or CDMA, or some combination of these protocols.

Of course, for other standards or techniques, RAKE fingers may not be used, although the DCO described herein may be equally useful for such standards or techniques.

Figure 1B:
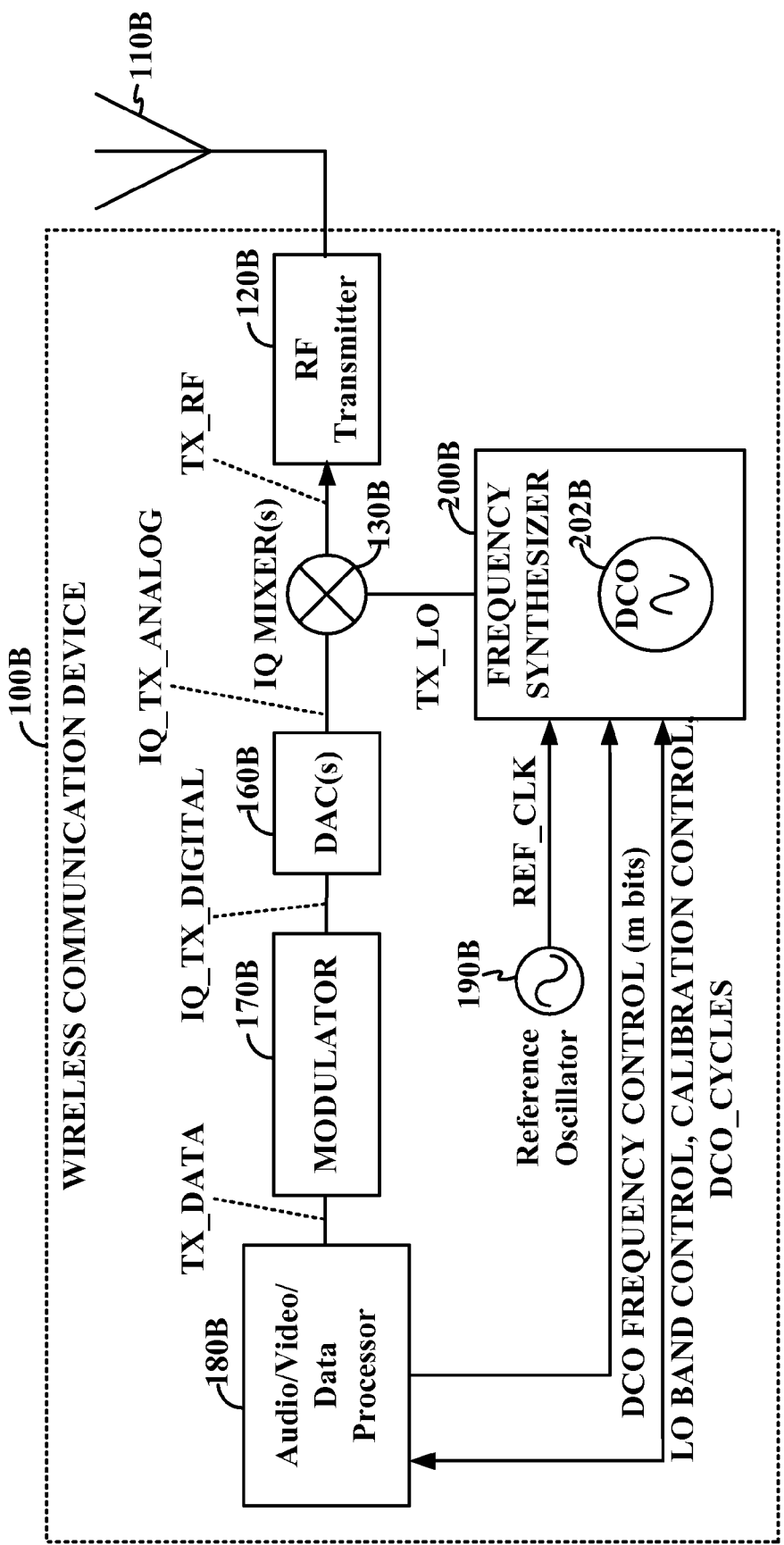
FIG. 1B is a block diagram of a wireless communication device incorporating a wireless transmitter.

FIG. 1B is a block diagram of a wireless communication device incorporating a wireless transmitter 100B in accordance with the present embodiment as shown. The devices in FIGS. 1A-1B may be part of the same wireless communication device (for example, they may be part of a wireless transceiver); alternatively, they may be separate devices, or discrete modules on the same device. The wireless communication device 100B in FIG. 1B may function in a similar manner as the wireless communication device of FIG. 1A, except that a transmission function is performed.

At the input, an Audio/Video/Data Processor 180B (processor 180B) sends a digital data stream, TX_DATA, to MODULATOR unit 170B. Processor 180B runs different algorithms depending on the source content such as encoding audio content (speech for example), encoding video content (from a video or still camera for example), or formatting the TX_DATA from a processor application (IP traffic, game content, etc). For example, in a CDMA system, the TX_DATA may include a PN code and/or spread with a Walsh code, or both, to produce I/Q digital spread spectrum baseband signals, IQ_TX_DIGITAL. IQ_TX_DIGITAL is converted to analog waveforms by digital to analog converters (DACs) 160B to produce I/Q analog baseband signals (IQ_TX_ANALOG). Processor 180B also controls frequency synthesizer 200B and DCO 202B with DCO frequency control (m bits), LO band control (one or more bits depending on the number of TX_LO frequency bands), and DCO calibration measurement with a DCO_CYCLE signal and calibration control (the latter two are optional if not self-contained within frequency synthesizer 200B or DCO 202B) as will be explained in reference to FIG. 2A and FIGS. 9A-9B.

Frequency synthesizer 200B provides local oscillator waveforms to I/Q mixers 130B (sometimes called frequency up-conversion). Frequency synthesizer 200B includes DCO 202B and utilizes reference oscillator 190B to frequency and phase lock DCO 202B to the REF_CLK signal. I/Q mixers 130B combine I/Q analog baseband signals (IQ_TX_ANALOG) and frequency up-converts to radio frequency (TX_RF). TX_RF signal is further processed by RF transmitter 120B. RF transmitter 120B may include one or more voltage gain amplifiers (VGAs), driver amplifiers (DAs), and power amplifiers (PAs), and RF filters depending on the circuit type and application. RF transmitter 120B transmits the modulated RF signal from wireless communication device 100B via antenna 110B.

As noted above, some wireless standards make use of two or more communication techniques, such as GSM systems, which use a combination of TDMA and FDMA modulation. GSM stands for Global System for Mobile Communications. A number of wireless networking standards, and other wireless communication standards and techniques have also been developed, including several IEEE 802.11 standards, Bluetooth standards, and emerging ultra-wideband (UWB) techniques and standards. Circuits employing these standards and techniques may use oscillators in general, and DCOs in particular, in the generation and demodulation of wireless signals.

Exemplary wireless communication devices include cellular or satellite radiotelephones, radiotelephone base stations, computers that support one or more wireless networking standards, wireless access points for wireless networking, PCMCIA cards incorporated within portable computers, direct two-way communication devices, personal digital assistants (PDAs) equipped with wireless communication capabilities, and the like.

It will be appreciated that the wireless communication devices 100A and 100B of FIGS. 1A-1B are merely exemplary devices that can utilize the DCO calibration techniques described herein. Many other types of devices can also equally benefit from the teachings of this disclosure, including other types of wireless communication devices, or more generally, any wireless or wired devices with a DCO.

Examples of computing devices used in wireless networks, which can equally benefit from the DCO calibration techniques described in this disclosure, may include laptop or desktop computers, mobile phones such as cellular radiotelephones and satellite radiotelephones, data terminals, data collection devices, PDAs and other portable and non-portable computing devices.

As shown in previously, FIG. 1A and FIG. 1B are block diagrams of wireless communication devices (WCDs) 100A and 100B associated with wireless signal reception and transmission, respectively. Each of the wireless communication devices 100A and 100B contains a respective frequency synthesizer 200A and 200B. The respective frequency synthesizers 200A and 200B include DCOs 202A and 202B for generating a local oscillator of a particular frequency that is a function of a DCO frequency control input into the respective DCO 202A and DCO 202B as well as LO band control from processor 180A and processor 180B respectively. Each DCO (202A and 202B) in one aspect may include a plurality of tuning elements and an inductor capacity "tank" configuration, depending on the specific design. Illustrative architectures of DCOs according to this disclosure are discussed further in FIGS. 2A-2D.

Figure 2A:
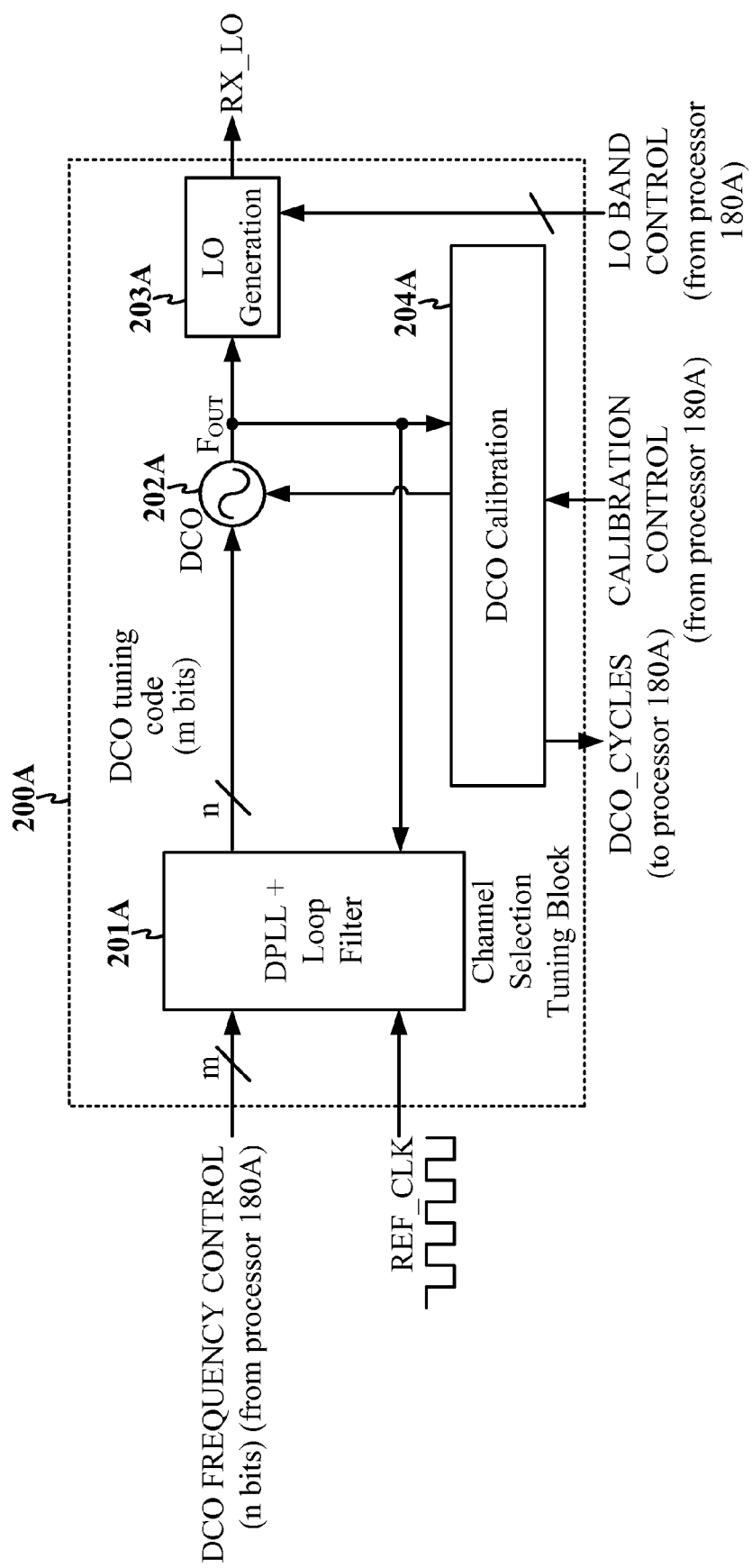
FIG. 2A is a block diagram of a frequency synthesizer with a digitally controlled oscillator (DCO).

FIG. 2A is a diagram of a frequency synthesizer with a digitally controlled oscillator (DCO) of FIG. 1A in accordance with the present embodiment as shown. Frequency synthesizer 200A is configured to generate a RX_LO signal for frequency down-conversion for WCD 100A of FIG. 1A. In a Zero-IF architecture, the RX_LO signal frequency is approximately equal to the desired receive RF channel.

Frequency synthesizer 200A includes a channel selection tuning block 201A comprising a RF DPLL and loop filter. Channel selection tuning block 201A compares REF_CLK from reference clock oscillator 190A (of FIG. 1A) to an output signal, $F_{OUT}$, from DCO 202A to lock DCO 202A to a desired frequency based on an input DCO Frequency Control (m digital bits) from processor 180A (of FIG. 1A). The output, DCO tuning code (n digital bits), from channel selection tuning block 201A, is a digital control signal consisting for tuning the frequency of output signal $F_{OUT}$ of DCO 202A. DCO 202A is an inductor-capacitor circuit that produces an oscillating output having an output frequency that is a function of the LC circuit. The output frequency may be changed, for example, by changing capacitance of components within DCO 202A.

In this example, $F_{OUT}$ is linearly inversely proportionally to the DCO tuning code (n bits). Thus, if n=4, and the input tuning code is 0100 a frequency F1 may be produced; if the tuning code is then changed to 0101, in the ideal case a frequency F2 that is lower than F1 is generated. The DCO 202A output signal, $F_{OUT}$, may be a sine wave or any other form depending on the specific circuit configuration.

The output signal $F_{OUT}$ is further processed by LO generation block 203A and frequency converted to a desired receive RF channel frequency, RX_LO. LO generation block 203A may be implemented using frequency dividers, frequency mixers, switches, or a combination of all three types of elements to create a variety of frequency multiplication or division ratios between signals $F_{OUT}$ and RX_LO. The LO generation block 203A multiplication or division ratio is selected with LO band control input (# of bits depends on the number of operating bands) from processor 180A (of FIG. 1A). The RX_LO signal frequency is equal to the desired RX RF channel frequency in a particular operating frequency band (US cellular, US-PCS, IMT, GPS, etc). RX_LO output signal is connected to the LO inputs of I/Q mixer(s) 130A in FIG. 1A.

The DCO calibration block 204A measures DCO 202A output, $F_{OUT}$, to determine whether DCO 202A requires DCO tuning code (n bits) calibration for one or more DCO 202A output frequencies. As will be shown in reference to FIGS. 9A-9B, DCO calibration block 204A includes an output, DCO_CYCLES, for counting the number of DCO 202A $F_{OUT}$ cycles over a measurement interval, Tm. The DCO_CYCLES signal indicates whether $F_{OUT}$ and the DCO 202A tuning code (n bits) is stable for a given operating frequency or requires calibration. Further description of DCO calibration block 204A will be provided in reference to FIGS. 9A-9B.

An equivalent block for frequency synthesizer 200B in WCD 100B is not shown for brevity. It should be readily understood that a similar block as shown for a receiver may be utilized for a transmitter and as many frequency synthesizers as required for multiple signal paths of both receive and transmit or receive only.

Figure 2B:
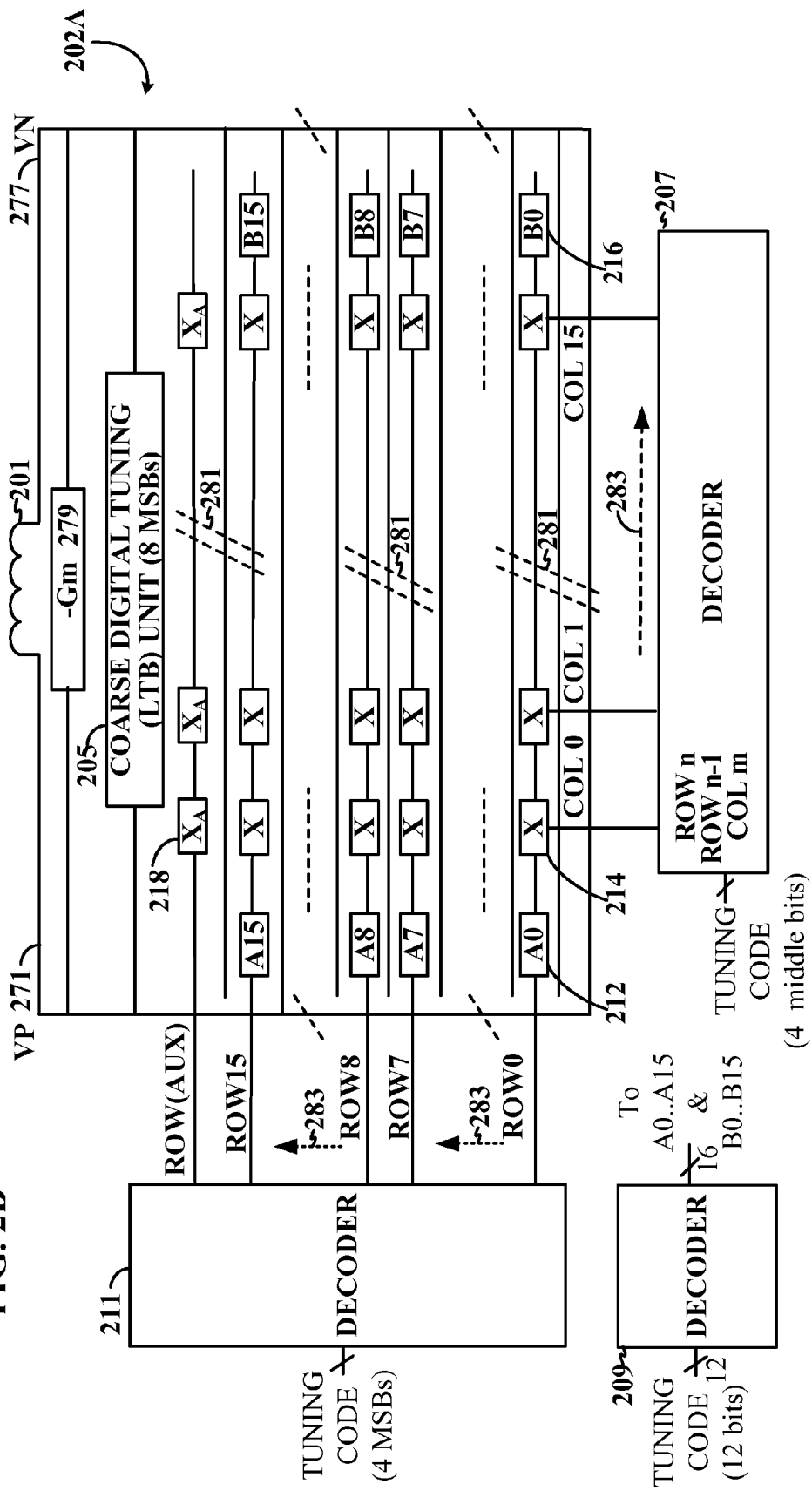
FIG. 2B is a circuit diagram of an illustrative DCO.

FIG. 2B is a circuit diagram of an illustrative DCO 202A of FIGS. 1A-1B and FIG. 2A in accordance with the present embodiment as shown. It will be appreciated that DCO 202A may be configured in a variety of ways depending on the application. The input to the DCO 202A is a DCO tuning code, which in this illustration is a 12 bit binary number. DCO 202A output is a voltage waveform (for example, at nodes 271 and 277) at a frequency determined in part by the DCO tuning code, as discussed below.

The example in FIG. 2B uses a plurality of decoders. It will be appreciated by those in the art, however, that another number of decoders, or in some instances one decoder, may be used, depending on the configuration. Alternatively, the decoding function may be performed in software by processor 180A, through one or more digital signal processors (not shown), or other hardware (not shown). In this example, the four most significant bits of the 12 bit tuning code are input into decoder 211, which in turn are used to provide decoded signals to ROW0 through ROW15 as well as ROW(AUX).

DCO 202A includes a matrix of sixteen rows (ROW0 to ROW15) and sixteen columns (COL 0 to COL 15). Each of COL 0 through COL 15 is associated with one of sixteen X tuning units (the slashes 281 indicate that the X and $X_A$ tuning units are repeated throughout the middle columns although not shown explicitly). Each of the sixteen X tuning units is also found in one of the sixteen rows ROW 0 through ROW 15. Thus, in this configuration, each of the 16×16=256 X tuning units may be addressed by a particular row and column. In addition to the sixteen X tuning units, each row from ROW0-ROW15 includes a corresponding A0-A15 tuning unit and a B0-B15 tuning unit. Each output of the ROW0-ROW15 outputs from decoder 211 feeds into each one corresponding A0-A15 tuning unit, the sixteen X tuning units, and one B0-B15 tuning unit. Further, sixteen $X_A$ auxiliary tuning units are controlled by a signal ROW(AUX) from decoder 211, which may comprise a multi-bit signal.

The entire 12 bit tuning code in this example is also input into decoder 209, which produces 16 bits of decoded data for controlling tuning units A0-A15 and B0-B15. The four middle bits of the 12 bit tuning code may be an input into decoder 207 to produce the decoded bits for controlling COL 0 through COL 15.

In the configuration of FIG. 2B, DCO 202A includes an inductor-capacitor and a circuit that generates a trans-conductance 279 (−Gm). Element 201 represents the inductor coil of the DCO 202A circuit. The output of DCO 202A toggles between a positive voltage VP (node 271) and a negative voltage VN (node 277). The frequency of this toggling is digitally controlled by a coarse digital tuning unit (large tuning bank, LTB 205, with 8 MSBs) and a plurality of sets of fine digital tuning units, e.g, A0-A15, X, $X_A$, and B0-B15. Together, sets A0-A15, X, $X_A$ and B0-B15 make up a matrix of fine tuning units (a main tuning bank or MTB) that may further be organized to drive output waveforms for individual segments of DCO 202A as discussed below.

LTB 205 may in one aspect be used to provide larger output frequency adjustments, e.g., on the order of 5 MHz per step (or LSB; with 8 bit binary control total, the coarse tuning range is about 256×5 MHz=1.28 GHz), whereas the fine tuning units (MTB) may be used to provide fine frequency tuning, e.g., on the order of 4 kHz or less per step (or LSB; with 12 bit binary control, the total fine tuning range is about 4096×4 kHz=16.384 MHz).

In the example above, the decoders may be used to provide mappings between one or more bits (or each bit) of the input tuning code and one or more fine tuning units. The mapping for the decoder may be provided by the values obtained for the frequency range of LTB and MTB, as well as LTB gap and overlap measurements, as discussed below. One skilled in the art, upon perusal of this written description, will appreciate that these mappings may be achieved through various known techniques without departing from the spirit and scope of the present disclosure.

In other embodiments, an auxiliary "mirror" array of fine tuning units (such as $X_A$) may reside adjacent the array of fine tuning units to provide the auxiliary components for adjusting the tuning range of the LTB for each segment (LTB0, LTB1, . . . LTB15) corresponding to the 4 MSBs of LTB 205. In other cases, these elements may reside outside the circuit layout of DCO 202A, outside the semiconductor die, or outside the module in which DCO 202A circuit resides.

Figure 2C:
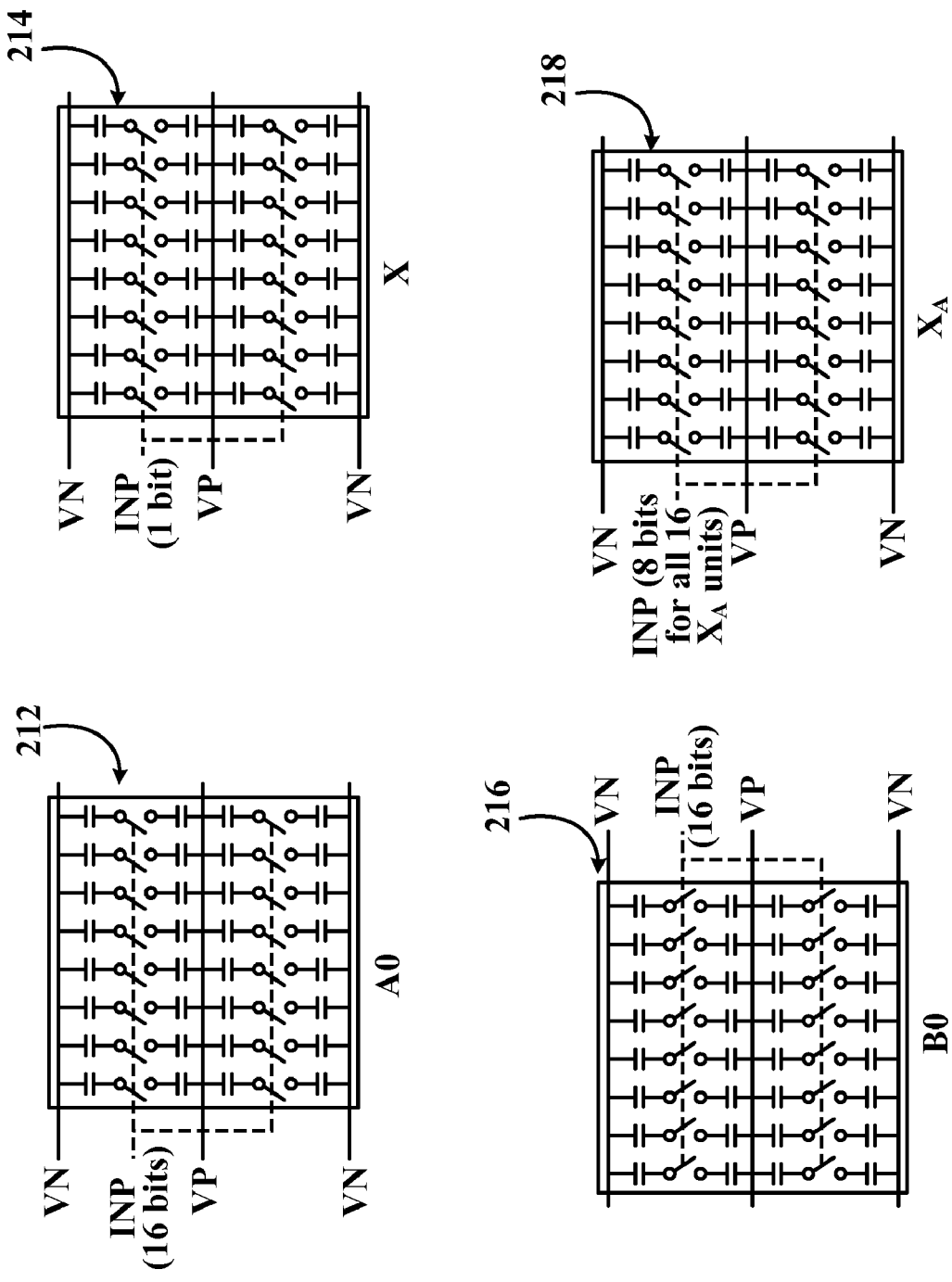
FIG. 2C is a circuit diagram of illustrative tuning units.

FIG. 2C is a circuit diagram of illustrative tuning units of FIG. 2B in accordance with the present embodiment as shown. FIG. 2C includes individual units 212, 214, 216, and 218, which correspond, respectively, to tuning units A0, X, and B0 and $X_A$. Each tuning unit is coupled to outputs VP and VN. Input INP corresponds to one or more bits of DCO 202A tuning codes, which control one or more switches (e.g., a gate of a CMOS transistor) for adjusting of DCO 202A output frequency. Input INP controls which capacitors in the tuning elements (see FIG. 2D) of tuning units 212, 214, 216, and 218 are on and off, and can thereby add or remove incremental amounts of capacitance to or from the circuit to achieve a desired output frequency. In the circuits shown in FIG. 2C, activating a switch will add additional capacitance to the respective tuning unit, thereby reducing the frequency of the output waveform incrementally. In one example, a logical one ("high" voltage level) will turn on a NMOS transistor and thereby closing a switch. For this reason, more logical ones in the tuning code—and hence a higher tuning code—result in a lower frequency in one aspect.

In the example of FIG. 2C, each of the tuning units 212, 214, 216, and 218 are structurally identical, although this need not be the case. Each contains sixteen individual tuning elements, which may comprise by way of example, two main capacitors (see FIG. 2D) each used for making the adjustments. In the simplified illustration shown, sixteen bits are input into tuning unit A0 (212) such that a separate bit may be used to control one of the sixteen individual tuning elements. For tuning unit X (214), a single bit may be used to control all sixteen elements such that all switches in the tuning unit X (214) are either concurrently on or off. In other embodiments, two or more bits may be used to control the tuning elements in tuning element X (214). Tuning unit B0 (216) functions in this example in a similar manner to tuning unit A0 (212). It will be appreciated that different types and numbers of tuning units and tuning elements may be equally suitable.

Figure 2D:
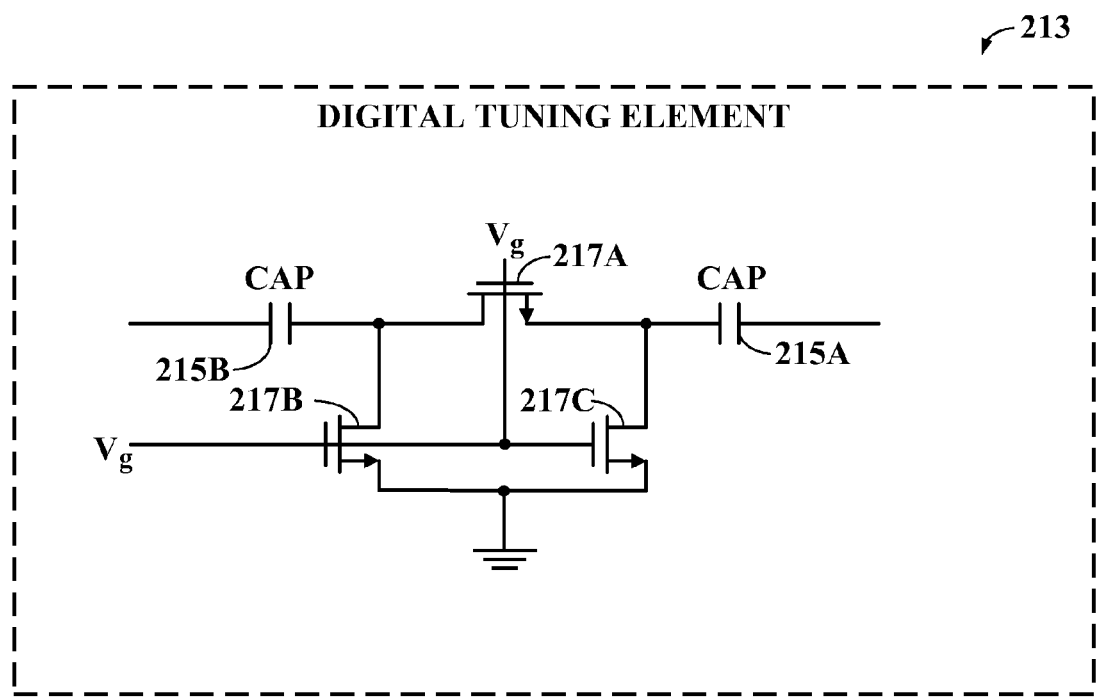
FIG. 2D is a circuit diagram of a digital tuning element.

Tuning unit $X_A$ (218), the auxiliary tuning units that may be used to cover cases of where the individual LTBs tuning range does not equal to the MTB tuning range in the plot of output frequency versus input tuning code as described in this disclosure. In one aspect, the auxiliary tuning unit $X_A$ (218) includes sixteen auxiliary tuning elements, each tuning element including sixteen small capacitors. Thus, in this example, sixteen tuning units $X_A$ (218) would have $16^2$=256 unit capacitors to control, requiring 8 bits binary control from the decoder as shown in FIG. 2B. In this case, an exemplary decoder mapping of tuning code to sixteen tuning units $X_A$ (218) control may be:

Aux MSB (Bit 7) controls 8 $X_A$ units
  Bit 6 controls 4 $X_A$ units
  Bit 5 controls 2 $X_A$ units
  Bit 4 controls 1 $X_A$ units
  Bit 3 controls half of the capacitors (8) in the remaining $X_A$ unit
  Bit 2 controls four (4) capacitors in the remaining $X_A$ unit
  Bit 1 controls two (2) capacitors in the remaining $X_A$ unit
  Bit 0 controls one (1) capacitor in the remaining $X_A$ unit FIG. 2D is a circuit diagram of a digital tuning element 213 of DCO 202A from FIG. 2C in accordance with the present embodiment as shown. Digital tuning element 213 is found within one of the tuning units (tuning unit X 214 in FIG. 2C). A multitude of digital tuning elements 213 may be included in an array of digital tuning elements 213 in DCO 202A, as discussed with reference to FIGS. 2B-2C. In an example DCO circuit design, 4096 or more digital tuning elements 213 may be included in such an array. Where the digital tuning elements 213 comprise fine tuning frequency adjustment (of the MTB), each added digital tuning element 213 may provide in one configuration approximately 4 kHz of control to the frequency of the toggling between VP and VN. These digital tuning elements 213 are very useful insofar as they provide sufficient resolution for the control of the frequency of DCO 202A in increments less than 4 kHz. Of course, the level of resolution of any given DCO remains a design detail that will vary depending on the nature of the application.

Each digital tuning element 213 in one aspect may comprise plate capacitors 215A and 215B, and three transistors 217A, 217B, and 217C between the plate capacitors 215A and 215B. The three transistors 217A, 217B, and 217C may comprise n-channel metal-oxide semiconductor (NMOS) transistors. More specifically, digital tuning element 213 comprises a first plate capacitor 215A, a second plate capacitor 215B, a first transistor 217A that couples the first plate capacitor 215A to the second plate capacitor 215B, a second transistor 217B that couples the second plate capacitor 215B to ground, and a third transistor 217C that couples the first plate capacitor 215A to ground.

The three transistors 217A, 217B, and 217C are, in this example, controlled by a common gate voltage Vg. A drain of the first transistor 217A is coupled to a first one of the plate capacitors 215A and a source of the first transistor 217A is coupled to a second one of the plate capacitors 215B. A drain of the second transistor 217B is coupled to the second one of the plate capacitors 215B and a source of the second transistor 217B is coupled to the ground voltage. A drain of the third transistor 217C is coupled to the first plate capacitor 215A and the source of the third transistor 217C is coupled to the ground voltage.

When the control bit (i.e., the gate voltage Vg to transistors 217A, 217B and 217C) is high (digital bit=1), all three transistors 217A, 217B, and 217C will be turned on. When this state occurs, the two capacitors 215A and 215B are effectively shunted to ground, discharging the voltages on the capacitors. When the control voltage (Vg) is low (digital bit=0), all three transistors 217A, 217B, and 217C will be turned off. When this state occurs, the two capacitors 215A and 215B will be floating at the sides of the transistors 217A, 217B, and 217C, effectively providing no loading to the circuit. The difference between the two states effectively changes capacitance in the digital tuning array to adjust the output frequency of toggling between VP and VN in a very fine increment. The two transistors 217B and 217C in this example provide fast recovery for the two nodes between capacitors 215B and 215A when the control voltage switches from low to high to maintain the two nodes to approximately ground level.

Figure 3:
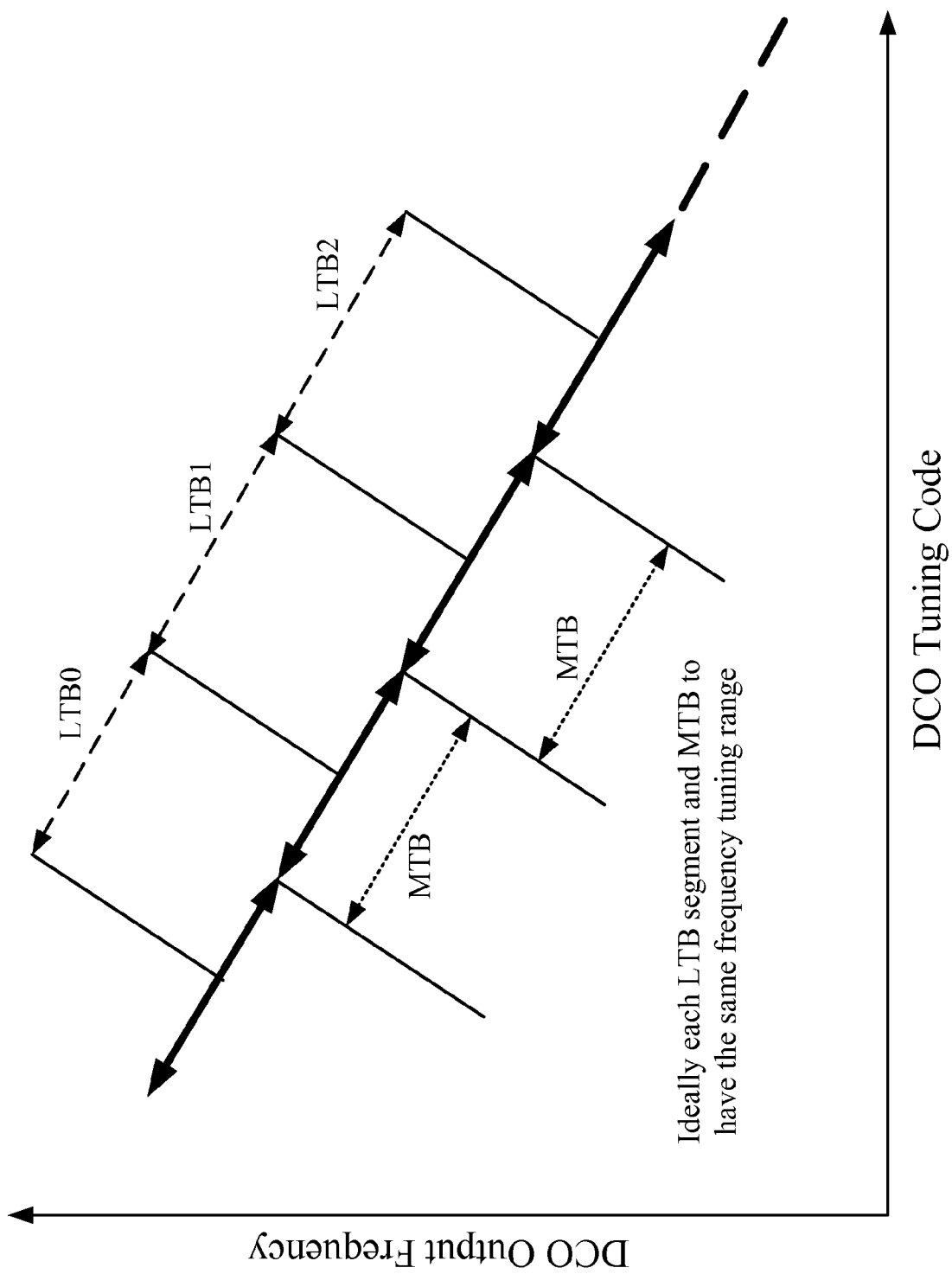
FIG. 3 is a plot of DCO output frequency versus DCO tuning code for an ideal DCO.

FIG. 3 is a plot of DCO output frequency versus DCO tuning code for an ideal DCO 202A of FIG. 2A in accordance with the present embodiment as shown. The plot shows DCO 202A tuning code on the horizontal axis and DCO 202A output frequency on the vertical axis. The horizontal axis from left to right represents a series of upwardly progressing DCO tuning codes. For the purposes of this example, the DCO tuning code is a combination of large tuning bank (LTB) and main tuning bank (MTB) values. The LTB input is an 8 bit digital word comprising 4 most significant bits (MSBs) to define the LTB segment (LTB0, LTB1, through LTB15) and 4 least significant bits (LSBs) for tuning within each LTB segment. Each segment is referred to for simplicity by only the top 4 MSBs and corresponds to a large tuning bank with multiple coarse tuning bank segments (LTB0, LTB1, LTB2 . . . ). One LTB segment corresponds, in this example, to the entire range of input control codes within a single four-bit MSB value. For example, the LTB0 (MSBs 0000) contains the range of 8-bit control codes from (0000,0000) to (0000,1111). LTB1 (MSBs 0001) contains the range (0001, 0000) to (0001,1111), and so on for LTB2, . . . LTB15.

The MTB input is a 16 bit digital word comprising equally weighted tuning elements as shown in FIGS. 2A-2C. The MTB tuning range is greater than individual LTB segment tuning range (4 MSBs). The MTB frequency tuning resolution may be thousands of times smaller than the LTB frequency tuning resolution and is utilized for fine frequency adjustment of DCO 202A.

In one embodiment, each LTB segment corresponds to a separate group of tuning elements for adjusting the output frequency based on DCO 202A tuning code. For example, in the exemplary DCO 202A characterized by FIG. 3, 4 MSBs correspond to $2^4$=16 LTB segments. Each of the 16 LTB segments may include an array of 16 thermometer encoded elements (for the 4 LSBs). One array may be used for one LTB segment, another array for another LTB segment, and so on. Therefore, the LTB contains 16×16 or 256 coarse tuning elements. Where the MTB input tuning code has a length of n bits, then up to $2^n$ tuning elements may also be used. In this example, 16 bits of tuning control are available, and the structure may include $2^{16}$=65535 tuning elements (all with equal capacitive values when turned on). In practice, a combination of matched binary weighted capacitive tuning elements and equally weighted capacitive tuning elements can provide excellent DCO 202A tuning linearity with fewer overall tuning elements. FIG. 3 represents a case of DCO 202A negative frequency tuning vs. DCO 202A tuning code. That is, because the overall capacitance of the circuit increases as the DCO 202A tuning code is increased, the DCO 202A output frequency decreases as a function of an increasing DCO 202A tuning code. In other designs, the opposite may be the case.

Generally speaking, for the purposes of this embodiment, changes in the 8 MSBs correspond to higher level adjustments (LTB based) in output frequencies, whereas changes in the 16 LSBs correspond to lower level adjustments (MTB based) in the output frequencies. The segments may be implemented in DCO 202A by a variety of means. In one aspect discussed further below, DCO 202A is configured with an array of tuning elements that, together with the remaining DCO 202A circuit components (such as, for example, one or more circuit components discussed in connection with FIG.

2, above), collectively provide the adjustments in the DCO 202A output frequency waveform based on the DCO 202A tuning code digital input.

While FIG. 3 shows a straight line depicting a linear DCO 202A output frequency as a function of DCO 202A tuning code, in practice, DCO 202A do not provide continuous frequency control. Unlike an analog VCO, the digital nature of DCO 202A means that DCO 202A output frequency can only occur at discrete steps. However, for the majority of applications, the frequency steps can be made very small, such as on the order of a few kHz or less between consecutive DCO 202A tuning codes.

In the ideal case of DCO 202A characterized by FIG. 3, DCO output frequency tuning is monotonic over DCO 202A tuning codes. The output waveform from DCO 202A, $F_{OUT}$, decreases linearly as a function of DCO 202A tuning code. Unfortunately, any or a combination of issues such as (1) mismatches in DCO 202A circuit layout, (2) control line impedance and parasitic value differences corresponding to different code segments, and (3) process variations, tuning discontinuities occur which disrupt the linear relationship of DCO 202A output frequency versus DCO 202A tuning code. In the example of FIG. 3, layout mismatches, impedance and parasitic variations may occur more prominently between the groups corresponding to different segments.

Figure 4:
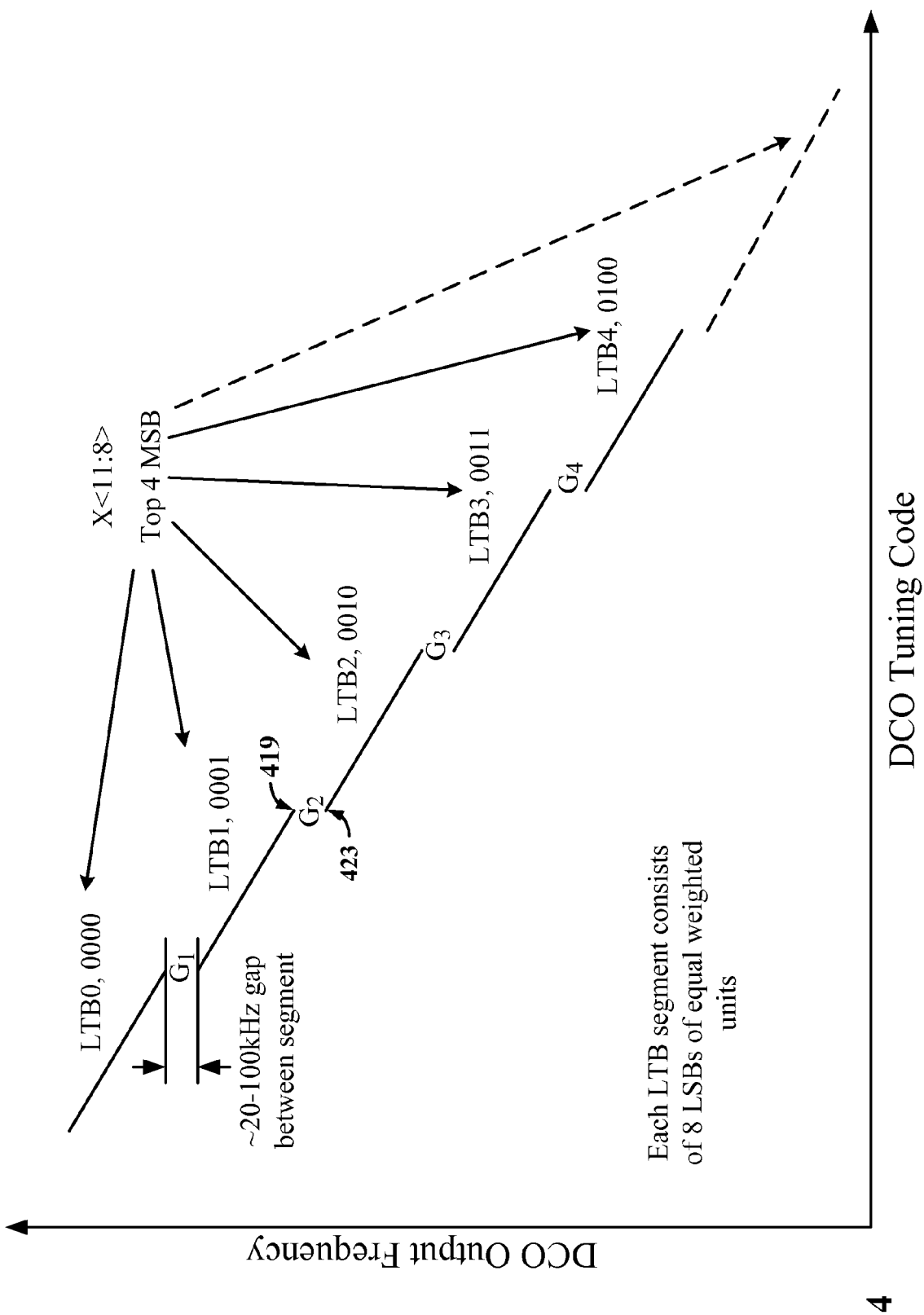
FIG. 4 is a plot showing DCO output frequency versus DCO control code depicting gaps between LTB segments.

FIG. 4 is a plot showing DCO output frequency versus DCO control code showing gaps for the DCO 202A of FIG. 2A in accordance with the present embodiment as shown. As in FIG. 3, the horizontal axis from left to right represents a series of upwardly progressing DCO 202A tuning codes. The vertical axis shows DCO 202A output frequency. Four gaps $G_1$, $G_2$, $G_3$, and $G_4$ occur between four of the segments LTB0 to LTB1, LTB1 to LTB2, LTB2 to LTB3, and LTB3 to LTB4. To illustrate, point 419 represents the rightmost point on segment 0001 (combined LTB1 and MTB tuning code 0001, 1111,1111,1111), and point 423 represents the leftmost point on segment 0010 (combined LTB2 and MTB tuning code 0010,0000,0000,0000). In the ideal case, the DCO 202A output frequency of point 419 would decrease to point 423 corresponding to the next consecutive tuning code by the same amount (e.g., 4 kHz) that the DCO 202A output frequency changes between consecutive DCO 202A tuning codes in other places within the corresponding LTB1 and LTB2 segments. However, due to practical design limitations as discussed above, a frequency gap $G_2$ exists whereby DCO 202A output frequency changes by a greater amount (e.g., by 20 to 100 kHz instead of 4 kHz) for consecutive control codes. The presence of gaps generally means that missing frequencies points exist and that DCO 202A cannot output under normal operating conditions. Such gaps result in reduced and often unpredictable circuit performance.

Figure 5:
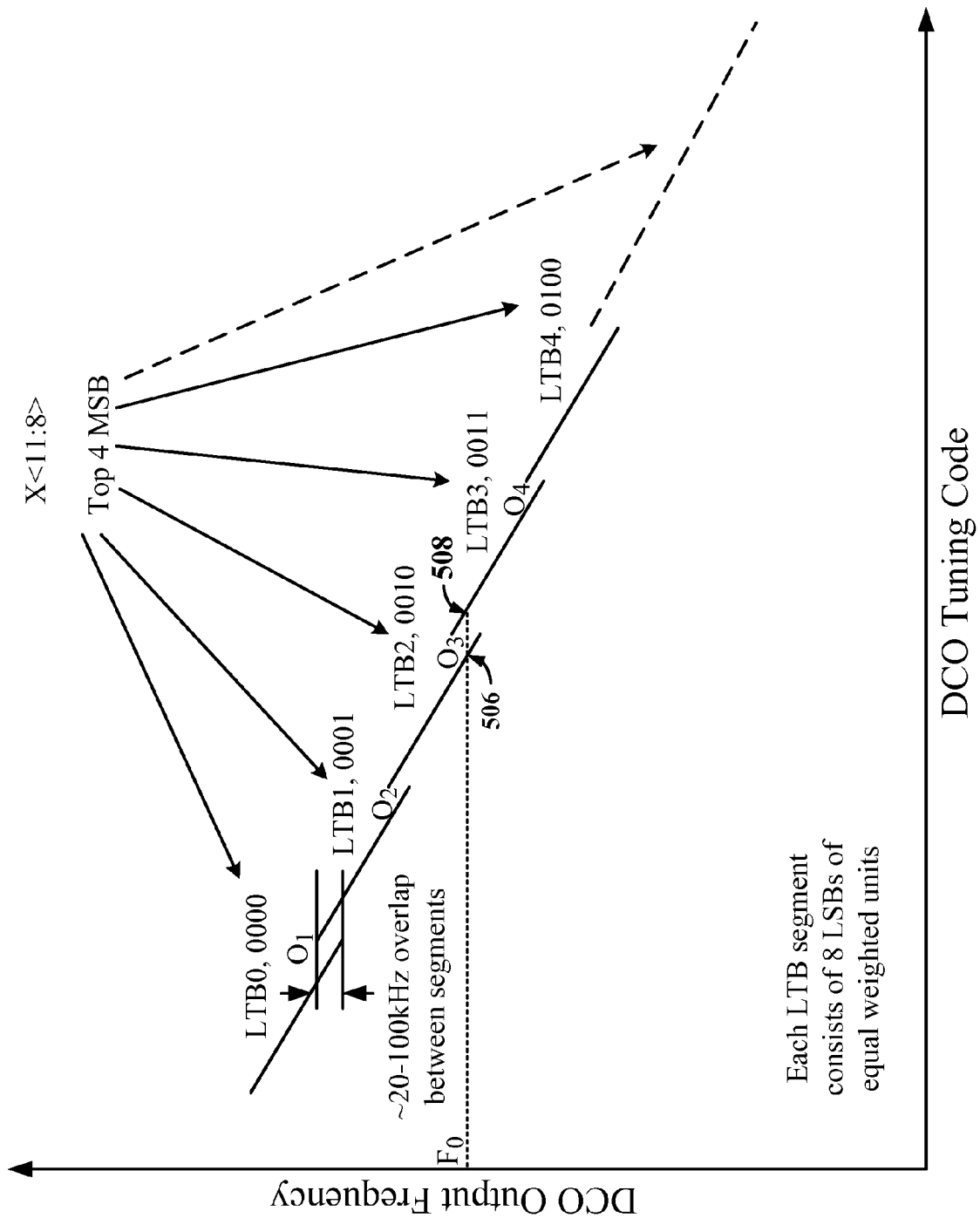
FIG. 5 is a plot showing DCO output frequency versus DCO control code depicting instances of overlap between LTB segments.

FIG. 5 is a plot showing DCO output frequency versus DCO control code depicting occurrences of overlap for the DCO 202A of FIG. 2A in accordance with the present embodiment as shown. Segments LTB0 and LTB1 contain overlap instance O1, segments LTB1 and LTB2 contain overlap instance O2, segments LTB2 and LTB3 contain overlap instance O3, and segments LTB3 and LTB4 contain overlap instance O4. In the overlap case, more than one DCO 202A tuning code may correspond to the same frequency. For example, point 506 may correspond to a control code of (combined LTB2 and MTB tuning code 0010,1111,1111, 1110), whereas point 508 corresponds to (combined LTB3 and MTB tuning code 0011,0000,0000,0001). Both DCO 202A tuning codes in the overlap case may correspond to the same frequency, as illustrated by the dashed line marked $F_0$. These duplicate frequencies tend to produce unreliable performance in frequency synthesizers and inject phase error into DPLL 201A of FIG. 2A.

Figure 6:
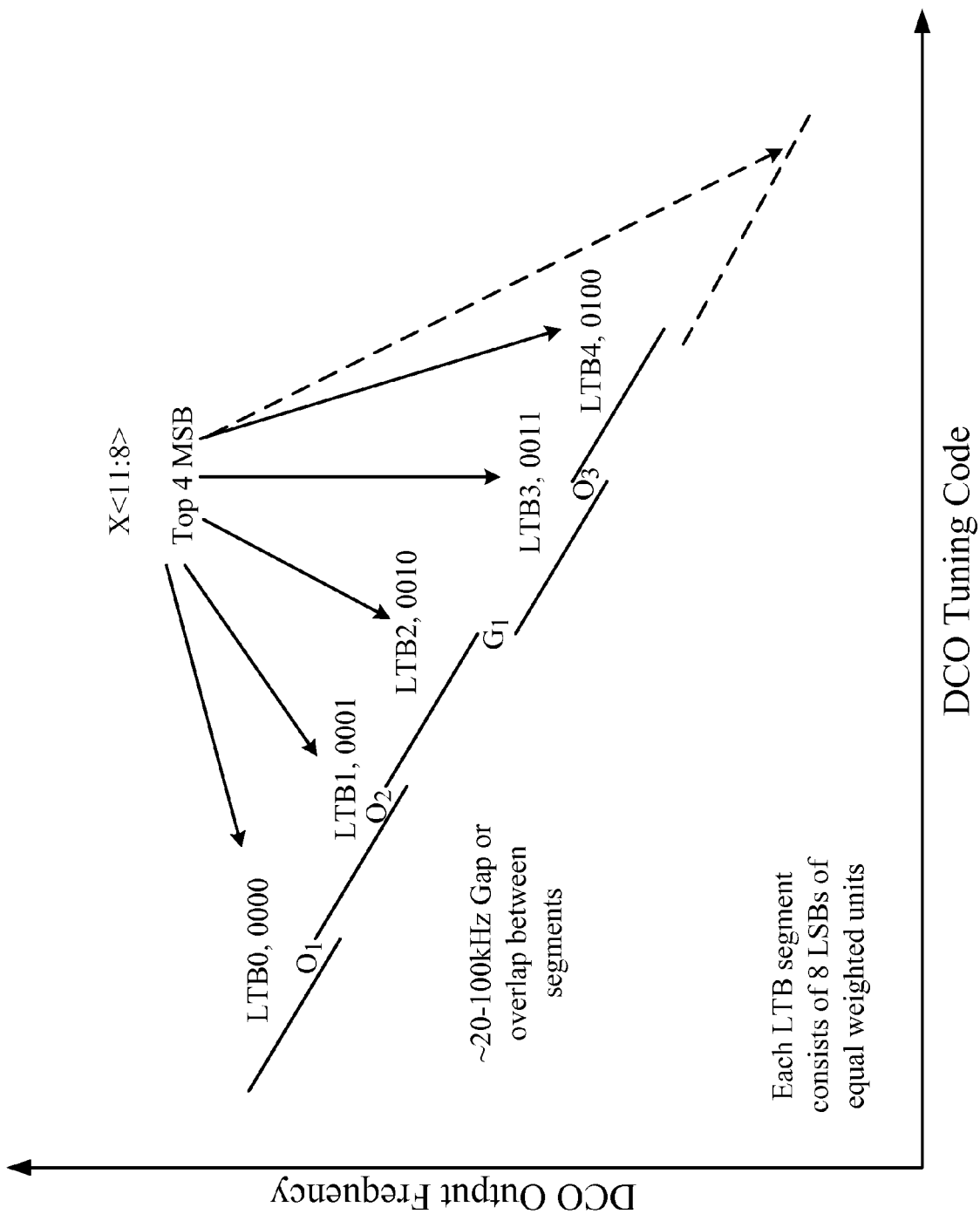
FIG. 6 is a plot showing DCO output frequency versus DCO control code depicting gaps and instances of overlap between LTB segments.

FIG. 6 is a plot showing DCO output frequency versus DCO control code showing discontinuities in the form of both gap G1 and instances O1, O2, and O3 of overlap for the DCO 202A of FIG. 2A in accordance with the present embodiment as shown. In a practical circuit such as, for example, the wireless communication device 100A of FIG. 1A implemented as an integrated circuit in a silicon CMOS process, discontinuities may be present in the form of either gaps or overlaps, or both. The presence of one or the other (or both) may be determined in part by the nature of the layout and circuit mismatches between the arrays of tuning elements that drive segments having consecutive control codes.

The open loop frequency of DCO 202A may be measured to determine overlap and gap occurrences and quantify these values for calibration. DPLL 201A (of FIG. 2A) is not needed, meaning that DCO 202A, in any circuit application, can be calibrated using this approach. DCO 202A output frequency may be measured using an accumulator and a time to digital converter for providing integer and fractional cycle counts (see FIGS. 9A-9B below), respectively.

Figure 7:
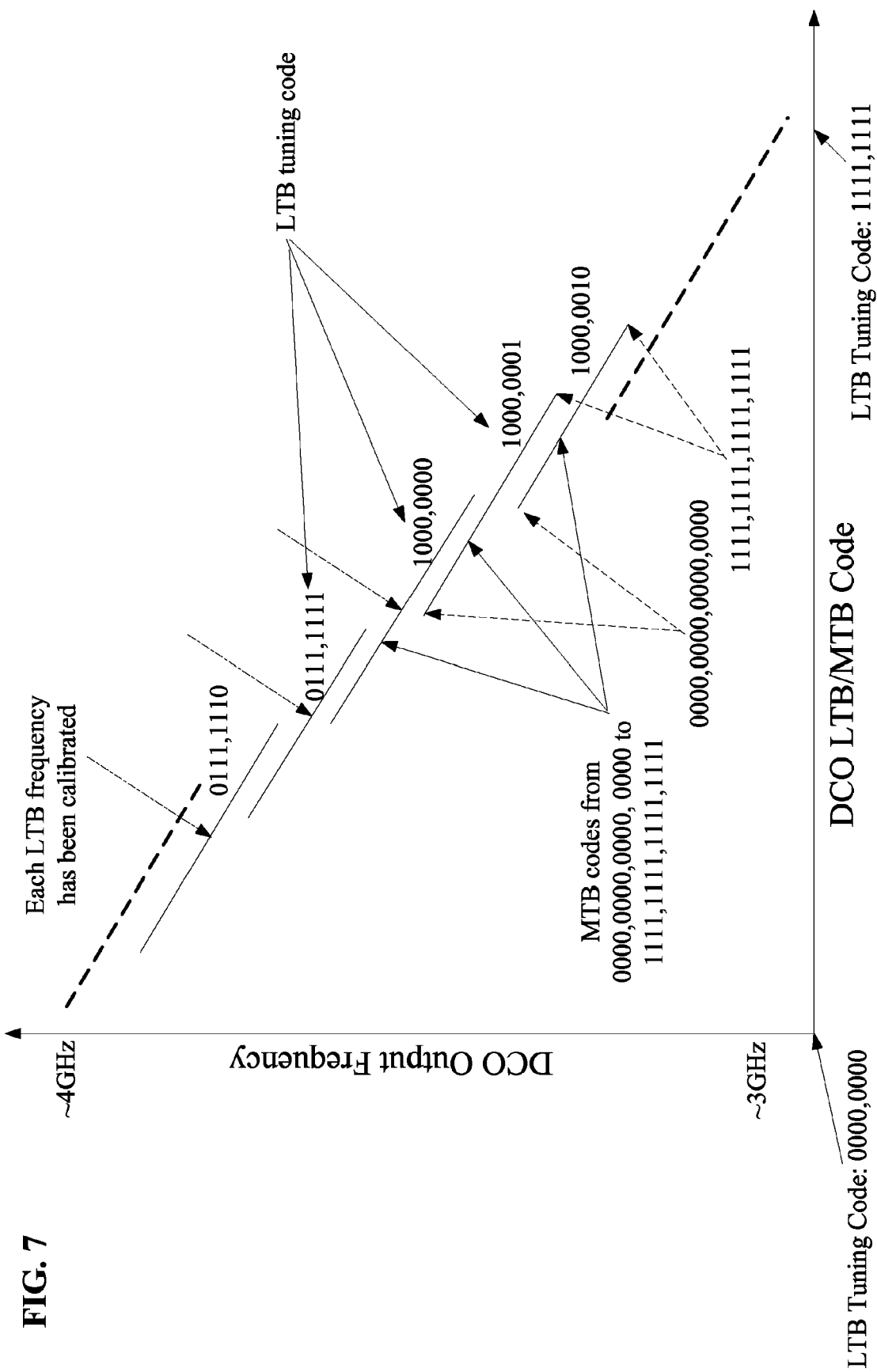
FIG. 7 is a method for removing DCO discontinuities.

FIG. 7 is a method for removing DCO discontinuities for DCO 202A of FIG. 2A in accordance with the present embodiment as shown. The method shown in FIG. 7, each LTB segment is intentionally designed to overlap adjacent LTB segments. The MTB is designed to have greater tuning range than any one LTB segment. The calibration method removes MTB codes to eliminate the overlap between LTB segments and match the tuning range of individual LTB segments to the available MTB codes (after removing unneeded tuning codes). An alternative method is to switch the LTB segment based on the MTB tuning code to eliminate any DCO output frequency overlap. In either instance, the calibration method is equivalent.

Figure 8:
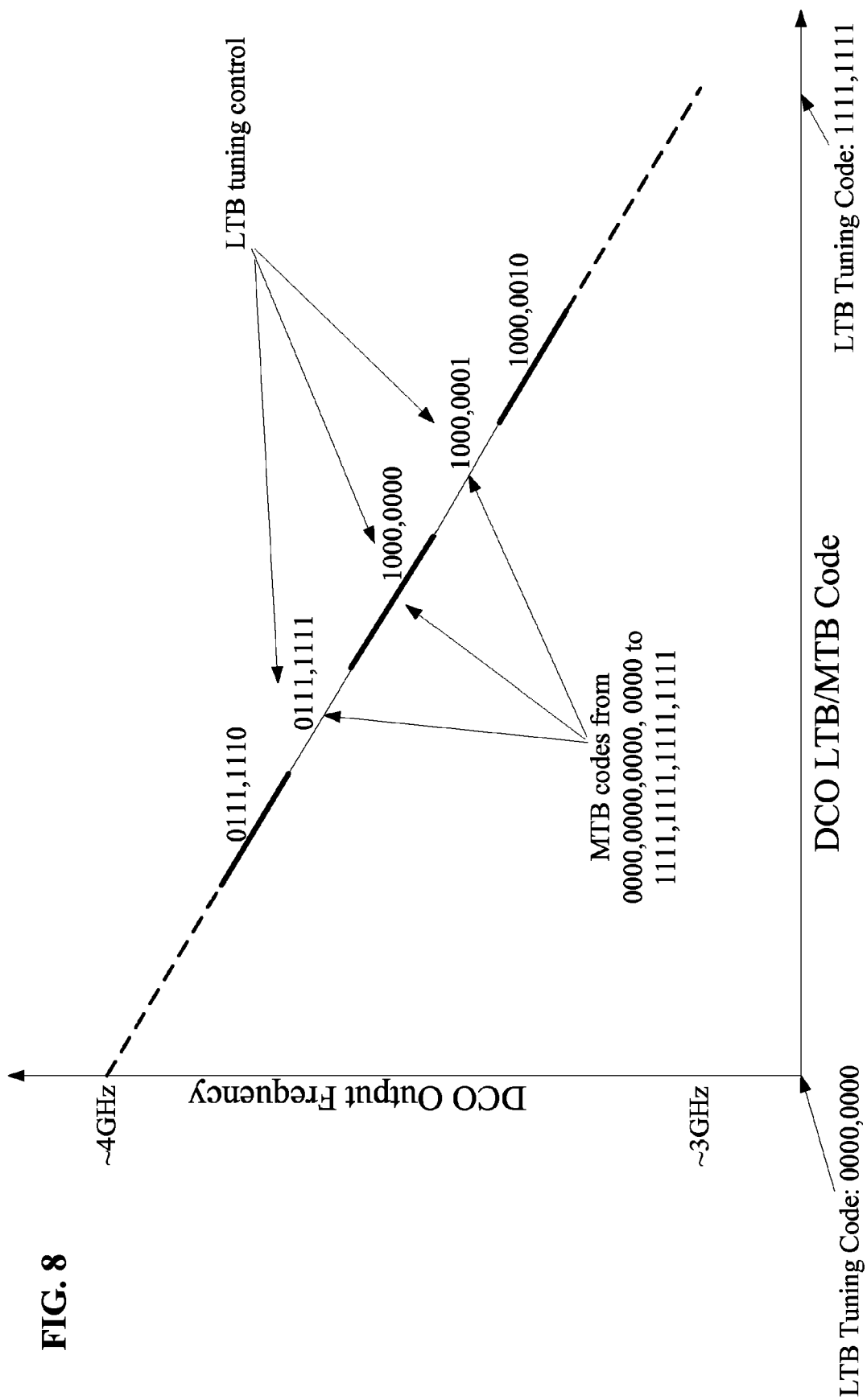
FIG. 8 is an alternate method for removing DCO discontinuities.

FIG. 8 is an alternate method for removing DCO discontinuities for DCO 202A of FIG. 2A in accordance with the present embodiment as shown. The method shown in FIG. 8, each LTB segment frequency tuning range is designed to be less than to the frequency tuning range of the MTB. The calibration method offsets each LTB segment frequency range with an auxiliary tuning bank code to eliminate the overlap or gaps between LTB segments. The MTB is designed to provide the fine frequency tuning of the DCO independent of each LTB segment.

FIG. 9A is a diagram of a circuit for measuring DCO cycles within a measuring period, Tm, for the DCO 202A of FIG. 2A in accordance with the present embodiment as shown. DCO 202A output signal, $F_{OUT}$, is an input to RF accumulator 903 and a time to digital converter (TDC) 909, both of which are driven by a reference frequency, REF_CLK from reference oscillator 190A and 190B (as shown in FIGS. 1A-2A and FIG. 9B). In some configurations for RF accumulator 903, an adder may be used in the event of an accumulator overflow.

The output signal of RF accumulator 903, ACC_OUT, is an input to a negative feedback element 905. Negative feedback element 905 generates an output signal ACC_STEP. ACC_STEP is the measured ratio between $F_{OUT}$ and $F_{REF\_CLK}$. The output signal of TDC 909 is TDC_OUT. ACC_STEP and TDC_OUT signals are provided to accumulator with deglitching block 907. Accumulator with deglitching block 907 is also supplied with reference frequency, REF_CLK and with ENABLE signal input (of FIG. 9B).

ENABLE signal input includes a rising edge $S_{TR}$ which triggers the beginning of the cycle count, and a falling edge $S_{TP}$ which terminates the cycle count. Output waveform DCO_CYCLES is produced.

In an aspect, the output of RF accumulator 903 is a (10-bit) modulo accumulator output, and the output of negative feedback element 905 is an accumulator step output. Accumulator with deglitching block 907 may resolve any timing offset between the integer and fractional waveforms. In this fashion, block 907 may include a detection circuit which lines up the cycle counts in time. The DCO_CYCLES signal output is a measurement of DCO 202A cycles for the prescribed measurement period, Tm. Discontinuities may be determined and quantified based on identifying different cycle counts for different DCO 202A tuning codes. Output frequency of DCO 202A is obtained by taking the inverse of the measured cycle count. The range of input tuning codes and the corresponding DCO_CYCLE measurements can be taken across DCO 202A output frequencies to correct DCO 202A tuning code nonlinearities.

Figure 10:
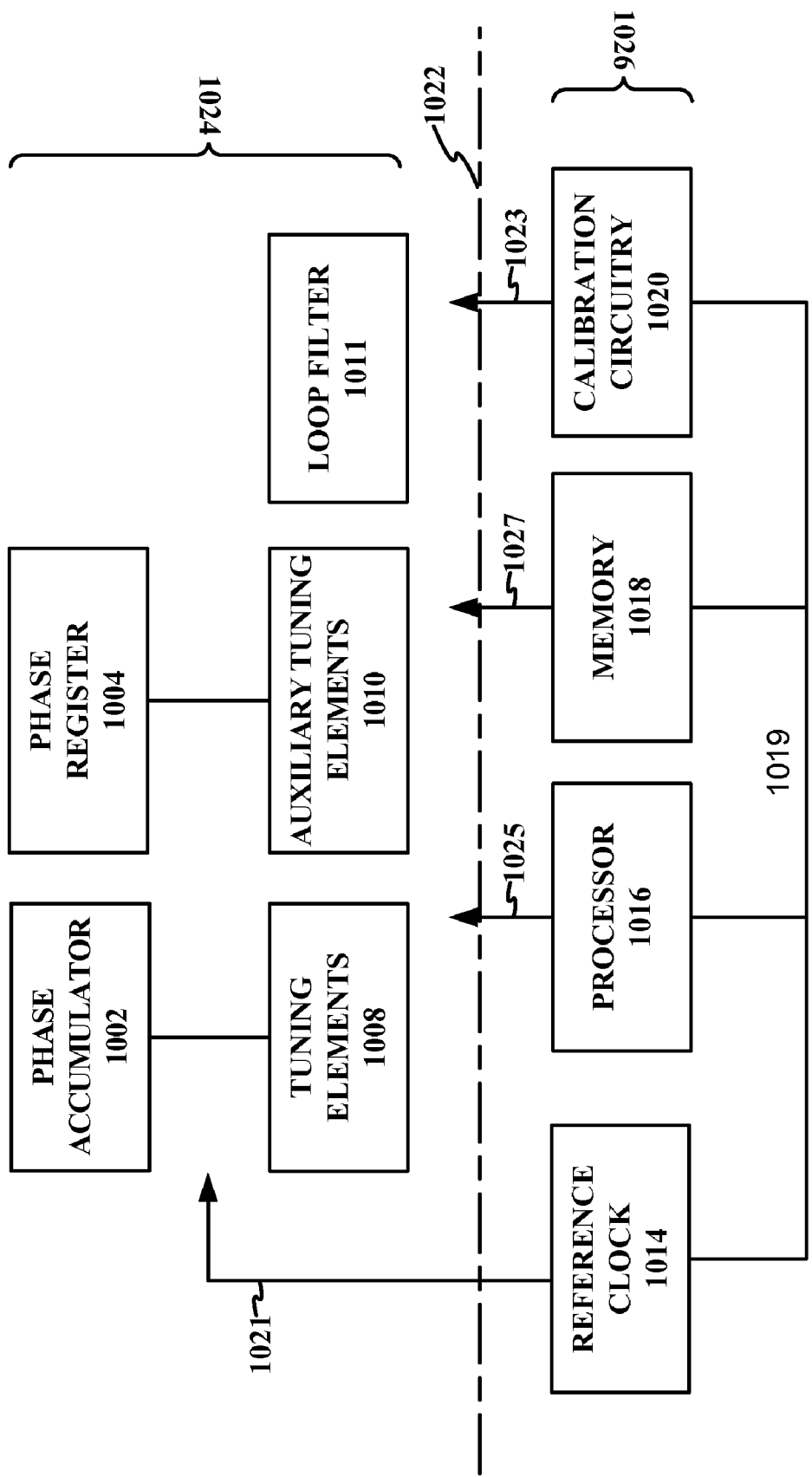
FIG. 10 is a block diagram of components for tuning a DCO.

FIG. 10 is a block diagram of components for tuning a DCO 202A of FIG. 2A in accordance with the present embodiment as shown. Component set 1024 includes phase accumulator 1004, phase register 1004, tuning elements 1008, auxiliary tuning elements 1010, and loop filter 1011. Component set 1026 includes reference clock 1014, processor 1016, memory 1018, and calibration circuitry 1020. The reference clock 1014 may comprise a crystal oscillator used for DCO 202A. In one aspect, component sets 1024 and 1026 are implemented on an integrated circuit, such as the wireless communication device 100A or 100B of FIG. 1A or FIG. 1B. For example, the component sets 1024 and 1026 may reside on a CDMA transceiver chip for use within a mobile station for transmitting and receiving wireless signals to and from a base station. The transceiver chip may include a digital block which includes various digital signal processing functions as well as an application processor. One or more of these blocks act as the processing system 1016. Memory 1018 may be included as one or more on-chip buffers or registers. Calibration circuitry 1020 may include one or more of the circuit components illustrated in FIG. 2A and FIGS. 9A-9B for determining values for gap and overlap in DCO 202A over a range of tuning codes.

In other aspects, the functions of component set 1026 may be realized on another chip or module. For example, processor 1016 may be included as another chip in a chipset. Alternatively, the processor 1016 function may be performed in software by a local computer at a bench station. Memory 1018 may be a separate memory from the chip where DCO 202A resides, such as a RAM, ROM, PROM, hard drive, removable storage, or another suitable media. The calibration circuitry 1020 may be integrated into the digital signal processing circuitry, processor 1016 or into the software algorithms running separately from WCD 100A or WCD 100B of FIGS. 1A-1B. Alternatively, it may be provided on another module. In one aspect, processor 1016, memory 1018, RF accumulator 903, negative feedback element 905, TDC 909 and accumulator with deglitching 907 are all provided on one CDMA transceiver chip containing DPLL 201A with DCO 202A. It will be appreciated, however, that any type of circuit device using DCO 202A may be used, and DPLL 201A is not required.

The components in set 1024 are grouped merely to indicate the interaction between these components as functionally part of DPLL 201A, rather than to indicate that they are necessarily physically proximate or that the component set 1026 is functionally distinct. Lines 1019 serve to indicate the general functional relationship between components in set 1026 rather than any specific relationship between the two linked components. Line 1022 indicates that, in one aspect, the two component sets (or some variation thereof) may be segregated into different sets or modules. Lines 1021, 1025, 1027, and 1023 also demonstrate the interaction between the components sets 1026 and 1024. Auxiliary tuning elements 1010 are shown in component set 1024. For gap cases, one or more such tuning elements are selected as discussed previously in reference to FIG. 8.

Figure 11:
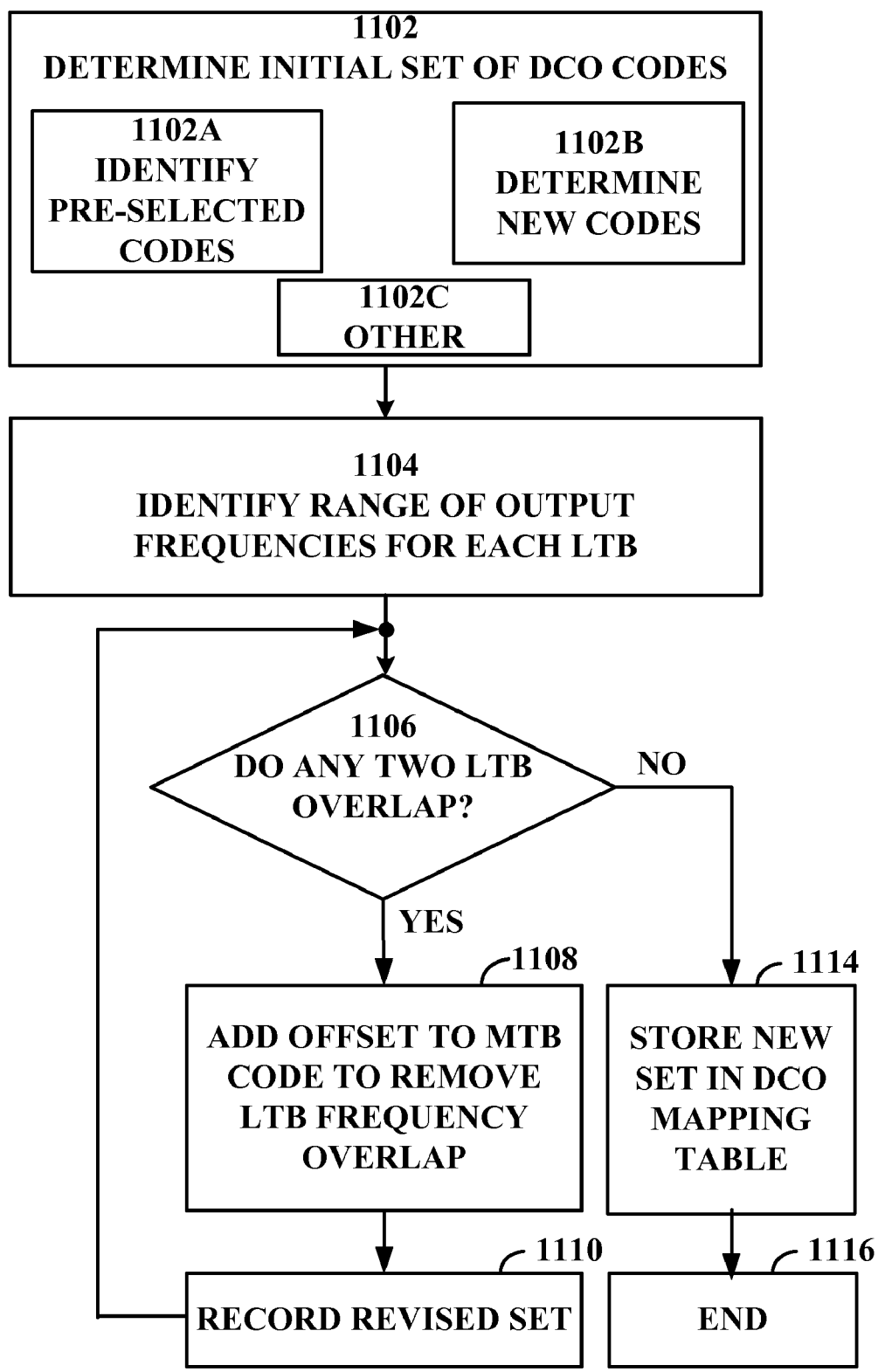
FIG. 11 is a flow diagram of a method for calibrating a DCO.

FIG. 11 is a flow diagram of an alternate method for calibrating a DCO 202A of FIG. 2A and FIG. 7 in accordance with the present embodiment as shown. At 1102, an initial set of DCO 202A tuning codes are determined for use with DCO 202A. The determination of this initial set may simply be an identification of a specified set of tuning codes (1102A) designated by a manufacturer or chip supplier. Alternatively, the determination may involve determining a new set of tuning codes (1102B), such as at a testing facility or in a procedure done by a supplier. The determination may be done in other ways (1102C), such as a combination of using known tuning codes along with making custom determinations. In an aspect, the initial set is stored in memory 1018 as shown previously in FIG. 10.

A range of DCO 202A output frequencies is thereupon identified (1104) for each LTB. In an aspect, this step is automated by the processor 1016 shown previously in FIG. 10 via software code written and stored in memory 1018, and performed by the processor 1016 along with calibration circuitry 1020 using one or more of the techniques discussed with reference to FIG. 9A and FIG. 9B. For example, a frequency counter may be used at the output of RF accumulator 907 in FIG. 9A to count the number of cycles, which in turn can be used to determine the output frequency for each input code.

Individual LTB tuning ranges do initially overlap if no DCO calibration has been performed (as previously note for the DCO design of FIG. 7) as is shown in step 1106. In some aspects, steps 1104 and steps 1106 are not consecutive, but rather repeat in sequence for each a plurality of DCO 202A tuning codes in the initial set. In other aspects, step 1104 may occur first. A variety of configurations are possible without departing from the spirit and scope of the disclosure. If there is an overlap between two consecutive LTB segments, an offset corresponding to the overlapping frequencies (1108) is added to the MTB to eliminate the offset, and a revised set of tuning codes is recorded (1110). When an individual LTB is calibrated, DCO 202A calibration control may revert back to 1106 in the configuration where one, a subset, or a segment of LTB DCO 202A tuning codes have not been analyzed (1108 followed by 1106).

After no more discontinuities between LTBs are identified (1106), the new set may be stored in a DCO mapping table (1114), which may comprise a non-volatile memory 1018. At that point, calibration is complete and the process ends (1116).

Figure 12:
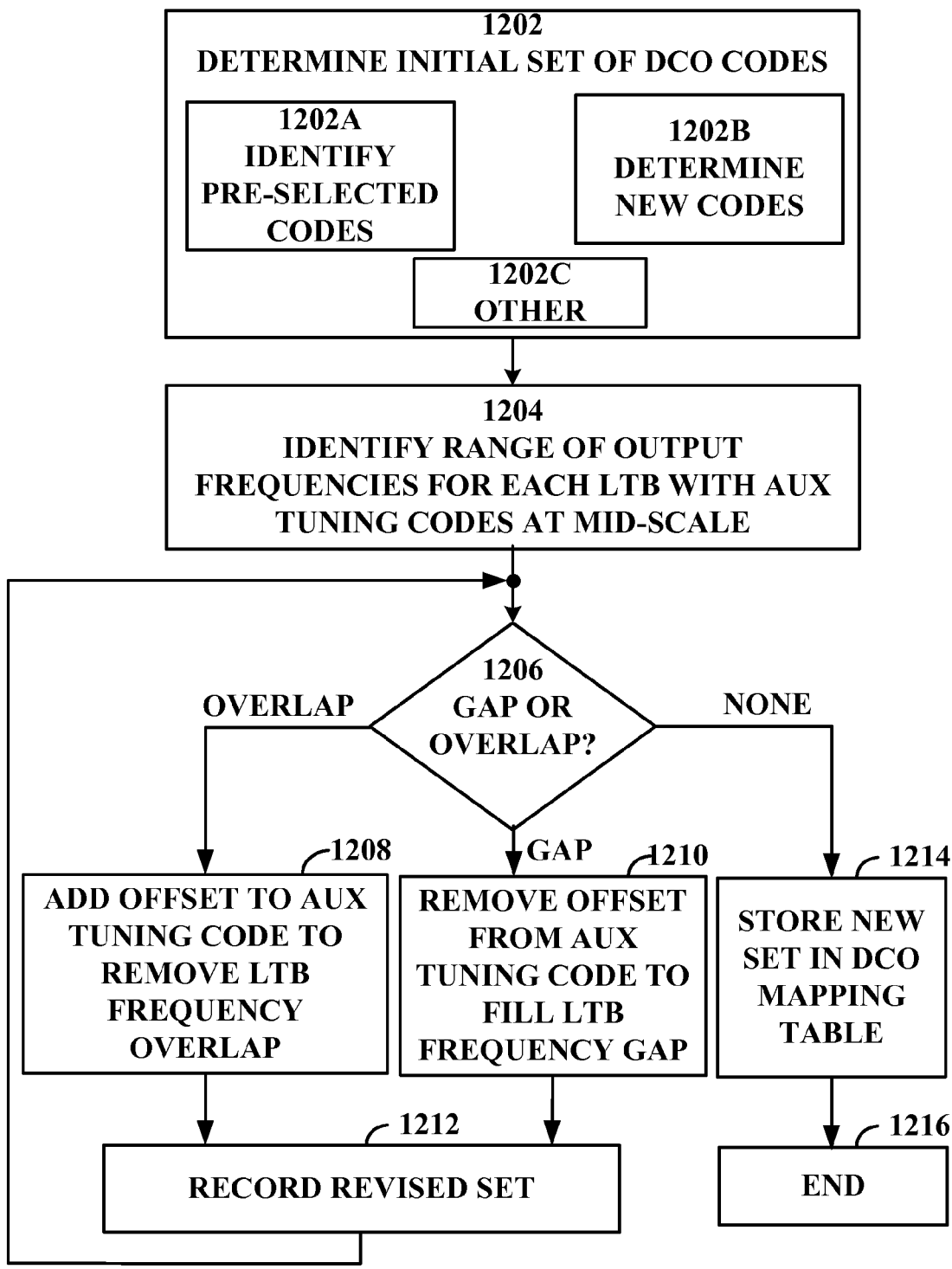
FIG. 12 is a flow diagram of an alternate method for calibrating a DCO.

FIG. 12 is a flow diagram of a method for calibrating a DCO 202A of FIG. 2A and FIG. 8 in accordance with the present embodiment as shown. At 1202, an initial set of DCO tuning codes are determined for use with DCO 202A. The determination of this initial set may simply be an identification of a specified set of codes (1202A) designated by a manufacturer or chip supplier. Alternatively, the determination may involve determining a new set of tuning codes (1202B), such as at a testing facility or in a procedure done by a supplier. The determination may be done in other ways (1202C), such as a combination of using known tuning codes along with making custom determinations. In an aspect, the initial set is stored in memory 1018 as shown previously in FIG. 10.

A range of output frequencies is thereupon identified (1204) for each LTB segment with the corresponding AUX tuning code set to mid-scale for each LTB segment. In an aspect, this step is automated by the processor 1016 shown previously in FIG. 10 via software code written and stored in memory 1018, and performed by the processor 1016 along with calibration circuitry 1020 using the techniques discussed with reference to FIG. 9A and FIG. 9B. For example, a frequency counter may be used at the output of the RF accumulator 907 in FIG. 9A to count the number of cycles, which in turn can be used to determine the output frequency for each DCO 202A tuning code.

The presence of gaps and overlaps in DCO 202A output frequency range are determined (1206) between LTB segments. In some aspects, steps 1204 and steps 1206 are not consecutive, but rather repeat in sequence for each a plurality of DCO 202A tuning codes in the initial set. In other aspects, step 1204 may occur first. A variety of configurations are possible without departing from the spirit and scope of the disclosure. If an overlap is present between LTB segments, an offset is added to the corresponding AUX tuning code of one of the two LTB segments corresponding to the overlapping frequencies (1208), and a revised set of DCO 202A tuning codes is recorded (1212). If a gap between LTBs is present, an offset is subtracted from the corresponding AUX tuning code of one of the two LTB segments to fill the gap (1210), and the revised set is recorded (1212). DCO 202A calibration control may revert back to 1206 in the configuration where one, a subset, or a segment of DCO 202A tuning codes are analyzed at a time.

After no more discontinuities are identified (1206), the new set may be stored in a DCO 202A mapping table (1214), which may comprise a non-volatile memory 1018. At that point, calibration is complete and the process ends (1216).

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The various illustrative logical blocks, modules, and circuits described in connection with the aspects disclosed herein, including the processing of FIG. 11, may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The teachings herein may be incorporated into (e.g., implemented within or performed by) a variety of apparatuses (e.g., devices). For example, one or more aspects taught herein may be incorporated into a phone (e.g., a cellular phone), a personal data assistant ("PDA"), an entertainment device (e.g., a music or video device), a headset (e.g., headphones, an earpiece, etc.), a microphone, a medical device (e.g., a biometric sensor, a heart rate monitor, a pedometer, an EKG device, etc.), a user I/O device (e.g., a watch, a remote control, a light switch, a keyboard, a mouse, etc.), a tire pressure monitor, a computer, a point-of-sale device, an entertainment device, a hearing aid, a set-top box, or any other suitable device.

The teachings herein are not limited to wireless devices, but may extend to any electronic device, module, or circuit, in which a DCO is or can be implemented. Such a device may include an IC or processor in itself, or another electrical circuit component, whether a "stand alone" component or module or an integrated part of another module or electronic device.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:
1. A method of calibrating a digitally controlled oscillator (DCO) with a coarse frequency tuning bank with multiple coarse frequency tuning segments, an auxiliary frequency tuning bank, and a fine frequency tuning bank, comprising:

determining an initial set of DCO tuning codes for operating the DCO utilizing the multiple coarse frequency tuning segments, the auxiliary frequency tuning bank and the fine frequency tuning bank, wherein each DCO tuning code has a coarse frequency tuning segment tuning code portion and a fine frequency tuning bank tuning code portion, wherein the fine frequency tuning bank tuning code portion controls the fine frequency tuning bank and the auxiliary frequency tuning bank;

identifying a range of output frequencies produced for each coarse frequency tuning segment when the auxiliary frequency tuning bank is set at mid-scale, wherein the range for each coarse frequency tuning segment corresponds to an associated set of DCO tuning codes;

identifying a gap between the ranges of two consecutive coarse frequency tuning segments; and adjusting the setting of the auxiliary frequency tuning bank of at least one of the DCO codes of the set of DCO codes corresponding to at least one of the two coarse frequency tuning segments thereby generating a revised set.

2. The method of claim 1, wherein the initial set and revised set are encoded in a mapping table.

3. The method of claim 1 wherein the DCO is part of a digital phase-locked loop (DPLL).

4. The method of claim 1 wherein the identifying a gap is performed at circuit initialization.

5. A wireless communication device, comprising:

a digitally controlled oscillator (DCO) comprising a coarse frequency tuning bank with multiple coarse frequency tuning segments, an auxiliary frequency tuning bank and a fine frequency tuning bank; and a processing system configured to determine an initial set of DCO tuning codes for operating the DCO utilizing the multiple coarse frequency tuning segments, the auxiliary frequency tuning bank, and the fine frequency tuning bank, wherein each DCO tuning code has a coarse frequency tuning segment tuning code portion and a fine frequency tuning bank tuning code portion, wherein the fine frequency tuning bank tuning code portion controls the fine frequency tuning bank and the auxiliary frequency tuning bank, to identify a range of DCO output frequencies produced for each coarse frequency tuning segment when the auxiliary frequency tuning bank is set at mid-scale, wherein the range for each coarse frequency tuning segment corresponds to an associated set of DCO tuning codes, to identify a gap between the ranges of two consecutive coarse frequency tuning segments, and to adjust the setting of the auxiliary frequency tuning bank of at least one of the DCO codes of the set of DCO codes corresponding to at least one of the two coarse frequency tuning segments thereby generating a revised set.

6. The wireless communication device of claim 5, wherein the initial set and revised set are stored in a mapping table.

7. The wireless communication device of claim 5, wherein the DCO is part of a digital phase-locked loop (DPLL).

8. The wireless communication device of claim 5, wherein the identifying of a gap is performed at circuit initialization.

9. An apparatus, comprising:

a digitally controlled oscillator (DCO) comprising a coarse frequency tuning bank with multiple coarse frequency tuning segments, an auxiliary frequency tuning bank and a fine frequency tuning bank;

means for determining an initial set of DCO tuning codes for operating the DCO utilizing the coarse frequency tuning bank, the auxiliary frequency tuning bank and the fine frequency tuning bank, wherein each DCO tuning code has a coarse frequency tuning segment tuning code portion and a fine frequency tuning bank tuning code portion, wherein the fine frequency tuning bank tuning code portion controls the fine frequency tuning bank and the auxiliary frequency tuning bank;

means for identifying a range of DCO output frequencies produced for each coarse frequency tuning segment when the auxiliary frequency tuning bank is set at mid-scale, wherein the range for each coarse frequency tuning segment corresponds to an associated set of DCO tuning codes;

means for identifying a gap between the ranges of two consecutive coarse frequency tuning segments; and means for adjusting the setting of the auxiliary frequency tuning bank of at least one of the DCO codes of the set of DCO codes corresponding to at least one of the two coarse frequency tuning segments thereby generating a revised set.

10. The apparatus of claim 9, wherein the initial set and revised set are stored in a mapping table.

11. The apparatus of claim 9, wherein the DCO is part of a digital phase-locked loop (DPLL).

12. The apparatus of claim 9, wherein the identifying at least one instance of coarse frequency tuning segment and fine frequency tuning bank mismatch is performed at circuit initialization.

13. A computer-program product comprising a non-transitory machine-readable medium comprising instructions executable by a machine for tuning a digitally controlled oscillator (DCO) comprising a coarse frequency tuning bank with multiple coarse frequency tuning segments, an auxiliary frequency tuning bank and a fine frequency tuning bank, the instructions comprising:

determining an initial set of DCO tuning codes for operating the DCO utilizing the coarse frequency tuning bank, the auxiliary frequency tuning bank, and the fine frequency tuning bank, wherein each DCO tuning code has a coarse frequency tuning segment tuning code portion and a fine frequency tuning bank tuning code portion, wherein the fine frequency tuning bank tuning code portion controls the fine frequency tuning bank and the auxiliary frequency tuning bank;

identifying a range of DCO output frequencies produced for each coarse frequency tuning segment when the auxiliary frequency tuning bank is set at mid-scale, wherein the range for each coarse frequency tuning segment corresponds to an associated set of DCO tuning codes;

identifying a gap between the ranges of two consecutive coarse frequency tuning segments; and adjusting the setting of the auxiliary frequency tuning bank of at least one of the DCO codes of the set of DCO codes corresponding to at least one of the two coarse frequency tuning segments thereby generating a revised set.

14. A method of method of calibrating a digitally controlled oscillator (DCO), wherein the DCO has a coarse frequency tuning bank having multiple coarse frequency tuning segments, an auxiliary frequency tuning bank, and a fine frequency tuning bank, wherein the DCO is configured to output a signal of an output frequency when the DCO is supplied with a DCO tuning code, wherein there is a plurality of said DCO tuning codes, wherein each DCO tuning code has a portion that sets the coarse frequency tuning bank, a portion that sets the auxiliary frequency tuning bank, and a portion that sets the fine frequency tuning bank, the method comprising:

(a) identifying a range of output frequencies produced for each coarse frequency tuning segment by supplying DCO tuning codes to the DCO when the auxiliary frequency tuning bank is set to a value;
(b) identifying an overlap between the ranges of two consecutive coarse frequency tuning segments; and
(c) in response to the identifying of (b) adjusting the setting of the auxiliary frequency tuning bank of at least one of the DCO codes of the set of DCO codes corresponding to at least one of the two coarse frequency tuning segments thereby generating a set of DCO tuning codes.

15. The method of claim 14, wherein adjusting of (c) results in removal of the overlap identified in (b).

16. The method of claim 14, wherein the adjusting of (c) involves adding an offset to the setting of the auxiliary frequency tuning bank.

17. The method of claim 14, wherein the value is a mid-scale setting of the auxiliary frequency tuning bank.

18. The method of claim 14, further comprising:
(d) identifying a gap between the ranges of two consecutive coarse frequency tuning segments; and
(e) in response to the identifying of (d) adjusting a setting of the auxiliary frequency tuning bank.

* * * * *